(12) United States Patent
Zellers et al.

(10) Patent No.: US 9,183,710 B2
(45) Date of Patent: Nov. 10, 2015

(54) LOCALIZED MULTIMODAL ELECTROMECHANICAL POLYMER TRANSDUCERS

(71) Applicant: Novasentis, Inc., Burlingame, CA (US)

(72) Inventors: Brian C. Zellers, Bellefonte, PA (US); Shihai Zhang, State College, PA (US); Christophe Ramstein, San Francisco, CA (US); Li Jiang, Union City, CA (US); Raj P. Pathak, Mountain Top, PA (US); M. Fabrice Domingues Dos Santos, Paris (FR)

(73) Assignee: Novasentis, Inc., State College, PA (US)

( * ) Notice: Subject to any disclaimer, the term of this patent is extended or adjusted under 35 U.S.C. 154(b) by 0 days.

(21) Appl. No.: 13/683,963

(22) Filed: Nov. 21, 2012

(65) Prior Publication Data

US 2014/0035735 A1  Feb. 6, 2014

Related U.S. Application Data

(60) Provisional application No. 61/679,641, filed on Aug. 3, 2012.

(51) Int. Cl.
*G08B 6/00* (2006.01)
*H02N 2/18* (2006.01)
(Continued)

(52) U.S. Cl.
CPC ............... *G08B 6/00* (2013.01); *H01L 41/083* (2013.01); *H01L 41/0926* (2013.01);
(Continued)

(58) Field of Classification Search
CPC ...... H01L 21/00; G06F 3/03547; G06F 3/041
USPC .................... 340/407.2, 517, 415, 7.6, 407.1; 310/311, 330
See application file for complete search history.

(56) References Cited

U.S. PATENT DOCUMENTS 5,263,876 A * 11/1993 Johnescu et al. ........... 439/620.1
5,519,278 A    5/1996 Kahn et al.
(Continued)

FOREIGN PATENT DOCUMENTS

JP    2010283926 A    12/2010
JP    2011172339 A    9/2011
(Continued)

OTHER PUBLICATIONS

International Search Report and Written Opinion for PCT/US2013/053594, mailed Dec. 23, 2013, 9 pgs.
(Continued)

*Primary Examiner* — Phung Nguyen
(74) *Attorney, Agent, or Firm* — Edward C. Kwok; Hogan Lovells US LLP

(57) ABSTRACT

A localized multimodal haptic system includes one or more electromechanical polymer (EMP) transducers, each including an EMP layer, such as an electrostrictive polymer active layer. In some applications the EMP transducer may perform an actuator function or a sensor function, or both. The EMP polymer layer has a first surface and a second surface on which one or more electrodes are provided. The EMP layer of the EMP actuator may be 5 microns thick or less. The EMP transducers may provide local haptic response to a local a stimulus. In one application, a touch sensor may be associated with each EMP transducer, such that the haptic event at the touch sensor may be responded to by activating only the associated EMP transducer. Furthermore, the EMP transducer may act as its own touch sensor. A variety of haptic responses may be made available. The EMP transducers may be used in various other applications, such as providing complex surface morphology and audio speakers.

43 Claims, 16 Drawing Sheets

(51) Int. Cl.
*H01L 41/083* (2006.01)
*H01L 41/09* (2006.01)
*H01L 41/113* (2006.01)
*H01L 41/193* (2006.01)
*H03K 17/96* (2006.01)

(52) U.S. Cl.
CPC ......... *H01L 41/1132* (2013.01); *H01L 41/193* (2013.01); *H02N 2/18* (2013.01); *H03K 17/9643* (2013.01); *H03K 2217/96062* (2013.01)

(56) References Cited

U.S. PATENT DOCUMENTS

| | | | |
|---|---|---|---|
| 6,423,412 | B1 | 7/2002 | Zhang et al. |
| 6,605,246 | B2 | 8/2003 | Zhang et al. |
| 6,703,257 | B2 | 3/2004 | Takeuchi et al. |
| 6,787,238 | B2 | 9/2004 | Zhang et al. |
| 6,809,462 | B2 * | 10/2004 | Pelrine et al. ............... 310/319 |
| 6,877,325 | B1 | 4/2005 | Lawless |
| 6,888,291 | B2 * | 5/2005 | Arbogast et al. ............ 310/331 |
| 7,038,357 | B2 | 5/2006 | Goldenberg et al. |
| 7,339,572 | B2 | 3/2008 | Schena |
| 7,368,862 | B2 | 5/2008 | Pelrine et al. |
| 7,567,681 | B2 | 7/2009 | Pelrine et al. |
| 7,971,850 | B2 | 7/2011 | Heim et al. |
| 8,222,799 | B2 | 7/2012 | Polyakov et al. |
| 8,362,882 | B2 | 1/2013 | Heubel et al. |
| 8,385,060 | B2 | 2/2013 | Dabov et al. |
| 8,390,594 | B2 | 3/2013 | Modarres et al. |
| 2003/0003962 | A1 | 1/2003 | Vooi-Kia et al. |
| 2007/0200467 | A1 | 8/2007 | Heydt et al. |
| 2009/0001855 | A1 * | 1/2009 | Lipton et al. ................ 310/331 |
| 2009/0002205 | A1 | 1/2009 | Klinghult et al. |
| 2009/0167507 | A1 | 7/2009 | Maenpaa |
| 2010/0079264 | A1 | 4/2010 | Hoellwarth |
| 2010/0090813 | A1 | 4/2010 | Je et al. |
| 2011/0038625 | A1 | 2/2011 | Zellers et al. |
| 2011/0116171 | A1 * | 5/2011 | Kwon et al. ................. 359/666 |
| 2011/0133598 | A1 * | 6/2011 | Jenninger et al. ............ 310/311 |
| 2011/0290686 | A1 | 12/2011 | Huang |
| 2012/0105333 | A1 * | 5/2012 | Maschmeyer et al. ........ 345/173 |
| 2012/0126663 | A1 * | 5/2012 | Jenninger et al. ............ 310/311 |
| 2012/0126959 | A1 | 5/2012 | Zarrabi et al. |
| 2012/0128960 | A1 | 5/2012 | Busgen et al. |
| 2012/0139393 | A1 * | 6/2012 | Choi et al. .................... 310/366 |
| 2012/0178880 | A1 | 7/2012 | Zhang et al. |
| 2012/0194448 | A1 | 8/2012 | Rothkopf |
| 2012/0206248 | A1 | 8/2012 | Biggs |
| 2012/0223880 | A1 | 9/2012 | Birnbaum et al. |
| 2013/0207793 | A1 * | 8/2013 | Weaber et al. ............. 340/407.2 |
| 2014/0085065 | A1 * | 3/2014 | Biggs et al. ................ 340/407.2 |
| 2014/0090424 | A1 | 4/2014 | Charbonneau et al. |
| 2014/0139328 | A1 | 5/2014 | Zellers et al. |
| 2014/0139329 | A1 | 5/2014 | Ramstein et al. |
| 2014/0139436 | A1 | 5/2014 | Ramstein et al. |
| 2014/0140551 | A1 | 5/2014 | Ramstein |
| 2014/0191973 | A1 | 7/2014 | Zellers et al. |

FOREIGN PATENT DOCUMENTS

| | | |
|---|---|---|
| JP | 2012134998 A | 7/2012 |
| KR | 20060107259 A | 10/2006 |
| KR | 20110110212 A | 10/2011 |
| KR | 20120013273 A | 2/2012 |
| KR | 20120063318 A | 6/2012 |
| KR | 20120078529 A | 7/2012 |
| KR | 20120105785 A | 9/2012 |
| WO | 2010085575 A1 | 7/2010 |
| WO | 2012063166 A1 | 5/2012 |

OTHER PUBLICATIONS

International Searching Authority Search Report and Written Opinion for PCT/US2013/071085, dated Mar. 17, 2014, 10 pages.
International Searching Authority Search Report and Written Opinion for PCT/US2013/071072, dated Mar. 13, 2014, 15 pages.
International Searching Authority Search Report and Written Opinion for PCT/US2013/071075, dated Mar. 20, 2014, 12 pages.
International Searching Authority Search Report and Written Opinion for PCT/US2013/071078, dated Mar. 28, 2014, 13 pages.
International Searching Authority Search Report and Written Opinion for PCT/US2013/071062, dated Apr. 28, 2014, 11 pages.
Matysek, Marc et al., "Combined Driving and Sensing Circuitry for Dielectric Elastomer Actuators in mobile applications", Electroactive Polymer Actuators and Devices (EAPAD) 2011, Proc. of SPIE vol. 7976, 797612, 11 pages.
Neese, Bret et al., "Large Electrocaloric Effect in Ferroelectric Polymers Near Room Temperature", Science vol. 321, Aug. 8, 2008, pp. 821-823.
Zhang Q. M. et al., "Giant Electrostriction and Relaxor Ferroelectric Behavior in Electron-Irradiated Poly(vinylidene fluoride-trifluoroethylene) Copolymer", Science vol. 280, Jun. 26, 1998, pp. 2101-2104.
Xia F. et al., "High Electromechanical Responses in a Poly(vinylidene fluoride-trifluoroethylene-chlorofluoroethylene) Terpolymer", Advanced Materials, vol. 14, Issue 21, Nov. 2002, pp. 1574-1577.
PCT International Preliminary Report on Patentability dated May 26, 2015, International Patent Application No. PCT/US2013/071072, 9 pages.
PCT International Preliminary Report on Patentability dated May 26, 2015, International Patent Application No. PCT/US2013/071075, 9 pages.
PCT International Preliminary Report on Patentability dated May 26, 2015, International Patent Application No. PCT/US2013/071078, 10 pages.
PCT International Preliminary Report on Patentability dated May 26, 2015, International Patent Application No. PCT/US2013/071085, 7 pages.
PCT International Preliminary Report on Patentability dated Jul. 7, 2015, International Patent Application No. PCT/IB2013/003212, 15 pages.
PCT International Search Report and Written Opinion date of mailing Oct. 15, 2014, International Patent Application No. PCT/IB2013/003212, 20 pages.

* cited by examiner

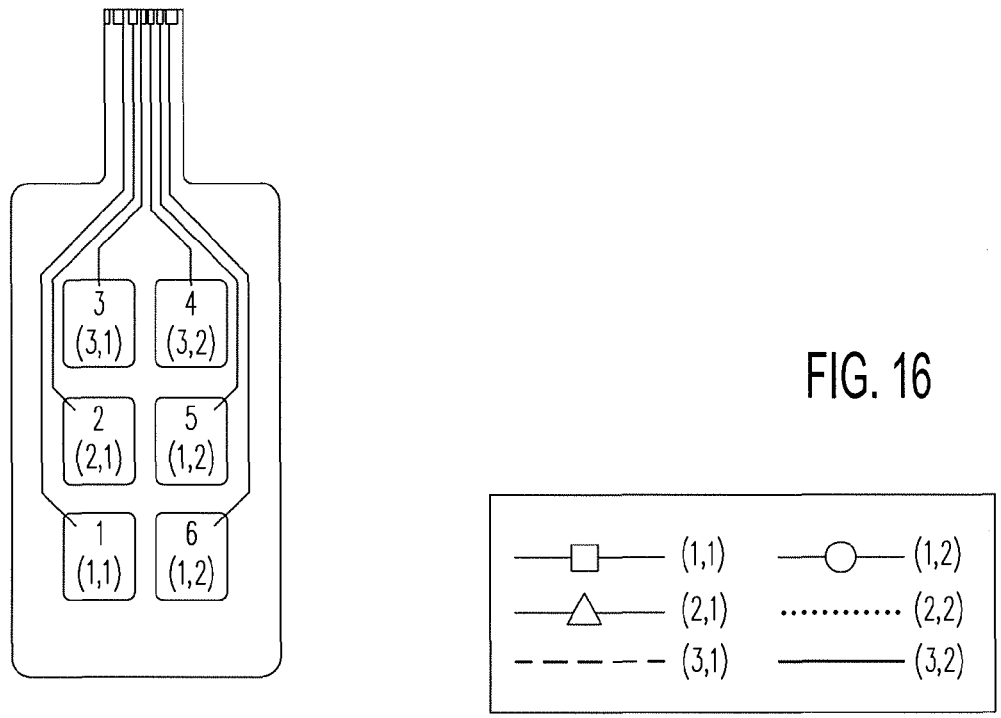
FIG. 16
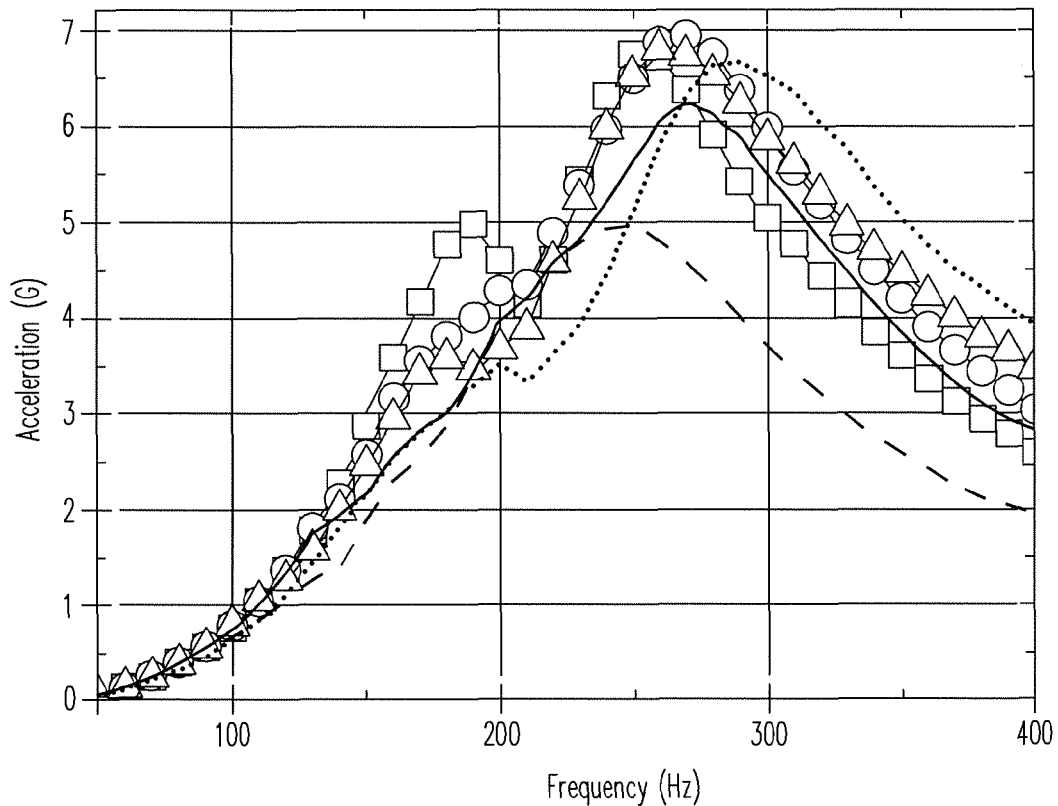

LOCALIZED MULTIMODAL ELECTROMECHANICAL POLYMER TRANSDUCERS

CROSS REFERENCE TO RELATED APPLICATIONS

The present patent application is related to and claims priority of U.S. Provisional Patent Application ("Provisional Application"), Ser. No. 61/679,641, filed Aug. 3, 2012, entitled "Electromechanical Polymer Actuators for Haptic Feedback." The disclosure of the Provisional Application is hereby incorporated by reference in its entirety.

BACKGROUND OF THE INVENTION

1. Field of the Invention

The present invention relates to transducer; in particular, the present invention relates to transducers that based on electromechanical polymer (EMP) layers, and designed for such applications as controllable structures, high-definition haptic feedback responses, audio speakers, or pressure sensors.

2. Discussion of the Related Art

Transducers are devices that transform one form of energy to another form of energy. For example, a piezoelectric transducer transforms mechanical pressure into an electrical voltage. Thus, a user may use the piezoelectric transducer as a sensor of the mechanical pressure by measuring the output electrical voltage. Alternatively, some smart materials (e.g., piezoceramics and dielectric elastomers (DEAP)) deform proportionally in response to an electric field. An actuator may therefore be formed out of a transducer based on such a smart material. Actuation devices based on these smart materials do not require conventional gears, motors, and cables to enable precise articulation and control. These materials also have the advantage of being able to exactly replicate both the frequency and the magnitude of the input waveform in the output response, with switching time in the millisecond range.

For a smart material that has an elastic modulus Y, thickness t, width w, and electromechanical response (strain in plane direction) $S_1$, the output vibration energy UV is given by the equation:

$$UV = \tfrac{1}{2} Y t w S_1^2 \qquad (1)$$

DEAP elastomers are generally soft, having elastic moduli of about 1 MPa. Thus, a freestanding, high-quality DEAP film that is 20 micrometers (μm) thick or less is difficult to make. Also, a DEAP film provides a reasonable electromechanical response only when an electric field of 50 MV/m (V/μm) or greater is applied. Thus, a DEAP type actuator typically requires a driving voltage of 1,000 volts or more. Similarly, a DEAP type sensor typically requires a charging voltage of 1,000 volts or more. In a handheld consumer electronic device, whether as a sensor or as an actuator, such a high voltage poses safety and cost concerns. Furthermore, a DEAP elastomer has a low elastic modulus. As a result, to achieve the strong electrical signal output needed for a handheld device application requires too thick a film. The article, "Combined Driving Sensing Circuitry for Dielectric Elastomer Actuators in Mobile Applications," by M. Matsek et al., published in *Electroactive Polymer Actuators and Devices (EAPAD)* 2011, Proc. Of SPIE vol. 7975, 797612, discloses providing sensor functions in dielectric elastomer stack actuators (DESA). U.S. Pat. No. 8,222,799 to Polyakov, entitled "Surface Deformation Electroactive Polymer Transducers," also discloses sensor functions in dielectric elastomers.

Unlike a DEAP elastomer, a piezoceramic material can provide the required force output under low electric voltage. Piezoelectric materials are crystalline materials that become electrically charged under mechanical stress. Converse to the piezoelectric effect is dimensional change as a result of imposition of an electric field. In certain piezoelectric materials, such as lead zirconate titanate (PZT), the electric field-induced dimensional change can be up to 0.1%. Such piezoelectric effect occurs only in certain crystalline materials having a special type of crystal symmetry. For example, of the thirty-two classes of crystals, twenty-one classes are non-centrosymmetric (i.e., not having a center of symmetry), and of these twenty-one classes, twenty classes exhibit direct piezoelectricity. Examples of piezoelectric materials include quartz, certain ceramic materials, biological matter such as bone, DNA and various proteins, polymers such as polyvinylidene fluoride (PVDF) and polyvinylidene fluoride-co-trifluoroethylene [P(VDF-TrFE)]. For further information, see, for example, the article "Piezoelectric Transducer Materials", by H. JAFFE and D. A. BERLINCOURT, published on pages 1372-1386 of PROCEEDINGS OF THE IEEE, VOL. 53, No. 10, October, 1965.

The strain of a piezoelectric device is linearly proportional to the applied electric field E:

$$S_1 \sim E \qquad (2)$$

As illustrated in equation (2), when used in an actuator device, a piezoelectric material generates a negative strain (i.e., shortens) under a negative polarity electric field, and a positive strain (i.e., elongates) under a positive electric field. However, piezoceramic materials are generally too brittle to withstand a shock load, such as that encountered when the device is dropped.

Piezoceramics and dielectric elastomers change capacitance in response to a mechanical deformation, and thus may be used as pressure sensors. However, as mentioned above, DEAP elastomers are generally soft, having elastic moduli of about 1 MPa. Thus, a freestanding, high-quality DEAP film that is 20 micrometers (μm) thick or less is difficult to make.

Unlike the piezoelectric materials that require a special type of crystal symmetry, some materials exhibit electrostrictive behavior, such as found in both amorphous (non-crystalline) and crystalline materials. "Electrostrictive" or "electrostrictor" refers to a strain behavior of a material under an electric field that is quadratically proportional to the electric field, as defined in equation (3)

$$S_1 \sim E^2 \qquad (3)$$

Therefore, in contrast to a piezoelectric material, an electrostrictive actuator always generates positive strain, even under a negative polarity electric field (i.e., the electrostrictive actuator only elongates in the direction perpendicular to the imposed field), with an amplitude that is determined by the magnitude of the electric field and regardless of the polarity of the electric field. A description of some electrostrictive materials and their behavior may be found, for example, in the articles (a) "Giant Electrostriction and relaxor ferroelectric behavior in electron-irradiated poly(vinylidene fluoride-trifluoroethylene) copolymer", by Q. M. Zhang, et al, published in Science 280:2101 (1998); (b) "High electromechanical responses in terpolymer of poly(vinylidene fluoride-trifluoroethylene-chlorofluoroethylene)", by F. Xia et al, published in Advanced Materials, 14:1574 (2002). These materials are based on electromechanical polymers. Some further examples of EMPs are described, for example, in U.S. Pat. Nos. 6,423,412, 6,605,246, and 6,787,238. Other examples include the EMPs whose compositions disclosed in pending U.S. patent application Ser. No. 13/384,196, filed on Jul. 15, 2009, and the EMPs which are blends of the P(VDF-TrFE) copolymer with the EMPs disclosed in the aforementioned U.S. Patents.

To achieve a substantially linear response and mechanical strains of, say, up to four (4) percent, in a longitudinal or transverse direction, the electrorestrictive EMPs discussed above requires an electric field intensity between 50 to 100 MV/m. In the prior art, to provide adequate mechanical strength and flexibility, the polymer films are at least 20 µm thick. As a result, an actuator based on such an electrostrictive EMP requires an input voltage of about 2000 volts. Such a voltage is typically not available in a mobile device.

Polyvinylidene difluoride (PVDF) and poly[(vinylidene-fluoride-co-trifluoroethylene (P(VDF-TrFE)) are well-known ferroelectric sensor materials. However, these materials suffer from low strain, and thus perform poorly for many applications, such as keys on a keyboard. An EMP sensor based on a high modulus, high strain material is therefore desired.

One area that EMPs find application is haptics. In this context, the term "haptics" refers to tactile user input actions. As software applications in portable electronics devices (e.g., cellular telephones, e-readers and tablets) have become more numerous and more diverse, greater data manipulation capabilities are required. In these devices, to interact with the software applications, users prefer the touch screen than secondary tethered input devices (e.g., mechanical keyboards). A touch screen is also more intuitive, as compared to other input devices, which may require user training and some requisite motor agility. However, typing on a virtual keyboard displayed on the limited space of a touch screen is necessarily slow and error-prone, as user does not receive the familiar "confirmation" of action of a mechanical keyboard.

The deficiency of the virtual keyboard on a touch screen can be overcome using haptics. A haptics-enabled touch screen may generate an immediate haptic feedback vibration when the touch screen is activated by user input. The feedback vibration makes the virtual element displayed on the touch screen more physical and more realistic. In a portable device (e.g., a mobile telephone), a haptic feedback action can reduce both user input errors and stress, allow a higher input speed, and enable new forms of bi-directionally interactions, Haptics is particularly effective for touch screens that are used in noisy or visually distracting environments (e.g., a battlefield or a gaming environment). For soldiers operating electronics or machines that uses multimodal or multisensory interactions (e.g., together with visual and auditory sensations), haptics can reduce input error rates and improve response speed. Similar advantages can be achieved by garners using handheld video game devices.

A handheld device with basic haptics typically generates single-frequency, single-amplitude vibrations. In such a device, an actuator is typically mounted at a corner of the device casing, so as to maximize the vibration felt by the user holding the device. Such an arrangement, however, generates a vibration throughout the entire device, rather than locally (i.e., at the point where the user's finger contacts the device).

Recently proposed high-definition (HD) haptics may provide significantly more tactile information to a user, such as texture, speed, weight, hardness, and damping. HD haptics uses frequencies that may be varied between 50 Hz to 400 Hz to convey complex information, and to provide a richer, more useful and more accurate haptic response. Over this frequency range, a user can distinguish feedback forces of different frequencies and amplitudes. Such a capability is applicable to typing on a HD haptics-enabled smart telephone that has a touch screen. In such a device, the feedback vibration is expected to be controlled by software. For a user to experience a strong feedback sensation, HD haptics in this frequency range, switching times (i.e., rise and fall time) between frequencies of 40 to milliseconds (ms) or less are required. The ability to provide such HD feedback vibrations in the 50 Hz to 400 Hz band, however, is not currently available. In the prior art, a typical device having basic haptics has an output magnitude that varies with the frequency of the driving signal. Specifically, the typical device provides a greater output magnitude at a higher frequency from the same input driving amplitude. For example, if a haptic driving signal includes two equal-magnitude sine waves at two distinct frequencies, the output vibration would be a superposition of two sine waves of different magnitudes, with the magnitudes being directly proportional to the respective frequencies. Such a haptic response is not satisfactory. Therefore, a compact, low-cost, low-driving voltage, and robust HD haptics actuation device is needed.

Haptic responses need not be limited to 50 Hz to 400 Hz vibrations. At lower frequency, a mechanical pressure response may be appropriate. Vibrations in the acoustic range can be made audible. A haptic response that can be delivered in more than one mode of sensation (e.g., mechanical pressure, vibration, or audible sound) is termed "multimodal." DEAP films or piezoelectric materials cannot provide the elastic moduli, strain, and robustness appropriate for multimodal haptic responses over the relevant frequency range.

SUMMARY OF THE INVENTION

According to one embodiment of the present invention, a localized multimodal haptic system includes one or more electromechanical polymer (EMP) transducers, each including one or more EMP layers, such as an electrostrictive polymer active layer. In some applications the EMP transducer may perform an actuator function or a sensor function, or both. The EMP polymer layer has a first surface and a second surface on which one or more electrodes are provided. The EMP layer of the EMP actuator may be 10 microns thick or less. The EMP transducers may provide local haptic response to a local stimulus. In one application, a touch sensor may be associated with each EMP transducer, such that the haptic event at the touch sensor may be responded to by activating only the associated EMP transducer. Furthermore, the EMP transducer may act as its own touch sensor. A variety of haptic responses may be made available.

According to one embodiment of the present invention, EMP transducers are provided for use in localized multimodal tactile feedback applications. For such applications, an EMP transducer provides high strains, vibrations or both under control of an electric field. For example, with an application of a DC voltage, the EMP transducer may bend or deform a deformable surface, so as to form keys of a physical keyboard. Furthermore, the EMP transducer can generate strong vibrations using an AC voltage. When the AC voltage falls within the acoustic range, the EMP transducer can generate audible sound, thereby functioning as an audio speaker. Thus, the EMP actuator of the present invention can provide a multimodal haptic response (e.g., generating deformable surface, vibration, or audible sound, as appropriate). In addition, the EMP transducer can also serve as a touch sensor, as a mechanical pressure applied on the EMP transducer can induce a measurable electrical voltage output. Therefore, the EMP transducer may serve as both a sensor and an actuator.

According to another embodiment, an EMP transducer of the present invention may also generate a temperature change through the electrocaloric effect described, for example, in the article "Large Electrocaloric Effect in Ferroelectric Polymers Near Room Temperature," by Neese, et al, published on Science, Vol. 321 no. 5890 pp. 821-823, 2008. The electrocaloric effect may be exploited to generate a cooling or heating effect to a user in a tactile system. In such an application, when an electric field is applied across an EMP transducer, the temperature of the EMP transducer increases due to a reduced entropy. Conversely, when the electric field is reduced or turned off, the temperature of the EMP transducer decreases due to increased entropy.

According to one embodiment of the present invention, an EMP transducer can also be fabricated in fabrics that can be provided in items of clothing. Such EMP transducer thus may provide clothing with multimodal functions.

Because of their flexibility and their ease in manufacturing, EMP transducers can be made very small even on a consumer device (e.g., the touch surface of a cellular telephone). As a result, tactile feedback in response to touch by a human finger may be localized to an area in the immediate vicinity of the touch stimulus, thereby offering a stronger sensation and a finer resolution. This ability to concentrate the tactile feedback to a localized zone under the user finger can also reduce the device's power requirement, as the action required may be confined to a small zone associated with the finger, without involving the entire device.

According to one embodiment of the present invention, when an excitation signal is applied across the electrodes of an EMP layer, the EMP layer elongates (i.e., it provides an electrostrictive response). Since the passive substrate's dimension remains unchanged, the EMP layer's elongation bends the EMP actuator that is associated with the electrodes and the substrate. The EMP layer is charged by the excitation signal. The excitation signal may have a frequency in a frequency range within the human acoustic range. In response to the excitation signal, the associated EMP actuator vibrates at substantially the frequency of the excitation signal. The frequency range may be between 0 Hz (i.e., DC) to 10,000 Hz, depending on the EMP actuator's application. For example, when the EMP actuator is used to provide a deformable surface, the frequency can vary from 0 Hz (DC) to 50 Hz; when the EMP actuator is used to provide a haptic feedback, the frequency may be in the range of 50 Hz to 400 Hz; and when the EMP actuator is used to provide certain acoustic functions, the frequency can be in the range of 400 Hz to 10,000 Hz. The vibration of the EMP actuator may provide an audible sound. The EMP actuator disclosed herein may have a response latency relative to the excitation signal of less than 40 milliseconds. In addition, the EMP actuator may have a decay time of less than 40 milliseconds. The EMP layer may have an elastic modulus greater than 500 MPa at 25° C. and an electromechanical strain greater than 1%, when experiencing an electric field of greater than 100 MV/m.

According to one embodiment of the present invention, the EMP actuator preferably deforms with an acceleration of greater than 10 Gs in some applications. To achieve the preferred acceleration, the excitation signal may include a DC offset voltage in a range between 25-75 volts. The DC offset voltage may provide an electric field of greater than 10 volts per micron. Further, the excitation signal may include an alternating voltage component having a peak-to-peak range that is less than 300 volts, for example.

According to one embodiment of the present invention, one or more of the EMP actuators of a haptic system may be attached to a substrate, which may be provided above or underneath a surface of a touch-sensing device, for example. The substrate may be rigid or flexible, and may be provided by a thin glass or plastic material. The substrate may be a graphical display on a handheld device. Such a substrate may be 1000 microns thick and include a large number of picture elements (pixels) provided on one surface. The EMP actuators may be arranged in a regular configuration, such as a regular 2-dimensional grid or array. The substrate may be a touch screen, such as the type of touch screens used in mobile telephones. In that application, one or more of the EMP actuators are actuated to provide haptic feedback in response to an input signal corresponding to a touch action by a user on the touch screen.

Unlike current haptics system which typically vibrates the entire electrical device, which is often rigid, the EMP actuator-enabled haptics can vibrate directly under the point of contact (e.g., a user's finger). In one embodiment, an array or grid of EMP actuators are provided, in which only the actuator under the touch is selectively activated, thereby providing a "localized" haptics feedback. When the EMP actuators are arranged in sufficiently close vicinity of each other, the haptic system may take advantage of haptic responses that are superimposed for constructive interference. In some embodiments, the substrate may vibrate in concert with the EMP actuators.

According to one embodiment of the present invention, the EMP actuators of the haptic system may be arranged in a non-regular configuration, such as in the form of the key layout of a QWERTY keyboard. When the EMP actuators are activated using a steady DC (0 Hz), the surface can be deformed to provide a regular physical keyboard. In that embodiment, when it is detected that a specific key is pressed by a user, an excitation signal may be provided to cause the associated EMP actuator to vibrate, so as to confirm to the user that the user's typing action has been detected.

According to one embodiment of the present invention, multiple EMP actuators of the haptic system may be arranged in an array or grid configuration on surface. When the EMP actuators are selectively activated, concave or convex bending of the surface at the EMP actuators results. In this manner, the surface can be deformed to allow certain graphical information to be presented.

According to one embodiment of the present invention, the EMP actuator of the haptic system may be activated by a high frequency signal having one or more frequency components in the range of 400 Hz to 10,000 Hz. The high frequency vibration of the EMP actuator (or the EMP actuator together with the substrate) can generate an audible acoustic signal. The EMP actuator can therefore act as an audio speaker. According to another embodiment of the present invention, multiple EMP actuators that are capable of performing such audio speaker function may be arranged in an array or grid on the haptics surface. As the EMP actuators are arranged in an array configuration, the haptics surface can serve as localized or directional speakers. When multiple actuators are selectively activated, the haptics surface can provide stereo or surround sound function.

According to one embodiment of the present invention, a controller may be used to provide control signals to the electrodes of each EMP actuator, such that each EMP actuator is individually controlled. The EMP actuators may be positioned in predetermined locations, such that the EMP actuators may be controlled to function, for example, as a phased array. The phased array focuses the haptic responses of the EMP actuators to a desired location. In another embodiment, the EMP actuators are positioned at predetermined locations so as to maximize displacements at one or more predetermined locations. One of the EMP actuators may achieve an acceleration magnitude of greater than 0.5 G in response to an excitation signal of a frequency between 50 Hz and 400 Hz.

The terms "haptics system" or "haptics surface", as used herein encompasses many variations and modifications. For example, the surface on which EMP actuators may be provided may be flat or planar, curved, cylindrical, spherical, parabolic, any non-planar, or three-dimension structure. The flexibility of the EMP actuators makes it possible to fabricate them in three-dimensional structures and form factors.

The haptic system of the present invention is especially applicable to a mobile electronic computational or communication device, such as a mobile telephone, a tablet computer, or a notebook computer.

The present invention may also provide an electromechanical system comprising one or more electromechanical polymer (EMP) sensors. Each such sensor may include (a) at least one EMP layer (preferably, many such layers) that includes an electrostrictive active layer, the EMP polymer layer having a first surface and a second surface; (b) one or more electrodes provided on at least one of the first surface and the second surface; and (c) a force receiving surface structurally connected with the EMP layer for transmitting an external force to the EMP layer. Each EMP layer may be 10 microns thick or less. The electromechanical system may include a rigid substrate bonded to one side of one of the EMP sensors, and wherein the force receiving surface being provided on the side of the EMP sensor opposite to the side of the EMP sensor bonded to the rigid substrate. The substrate may be bonded to the EMP sensor by an acrylate adhesive. Alternatively, the substrate may be bonded to the EMP sensor by thermal lamination. The force receiving surface may be provided on a compliant metal plate attached to one side of one of the EMP sensors. The external force exerted on the force receiving surface results in an electrical signal being induced across a selected pair of the electrodes, the electrical signal is typically between 1 to 5 volts.

According to one embodiment of the present invention, the electromechanical system further includes an EMP actuator and a control circuit that receives the electrical signal from the selected pair of the electrodes and which provides an output signal to the EMP actuator. The output signal causes the EMP actuator to vibrate. The vibration of the EMP actuator provides a haptics feedback or an audible sound.

According to one embodiment of the present invention, the electromechanical system includes a source of voltage that charges the EMP layer of each EMP sensor to a quiescent state prior to the force receiving surface transmitting the external force to the EMP layer. The electromechanical system may further include means for determining a change in charged state in the EMP sensor (e.g., a voltage change across the terminals, or a change in charge held in the EMP sensor), such as a resistor connected in series with the EMP sensor between terminals of the source voltage. In that example, the electromechanical system may further include a sensing circuit connected across the resistor, the sensing circuit being sensitive to a voltage change across the resistor. Alternatively, the sensing circuit may be connected in series with the resistor, the sensing circuit being sensitive to a current flowing in the resistor.

According to one embodiment of the present invention, one or more of the EMP sensors are configurable to serve as EMP actuators which provide a mechanical output in response to an electrical signal being imposed across the electrodes of the one or more of the EMP sensors.

The present invention is better understood upon consideration of the detailed description below in conjunction with the accompanying drawings.

BRIEF DESCRIPTION OF THE DRAWINGS

FIG. 16 shows multi-layer EMP actuators 1600, arranged in a 3×2 array, being adhesively bonded to PET substrate 1601, in accordance with one embodiment of the present invention.

DETAILED DESCRIPTION OF THE PREFERRED EMBODIMENTS

The electromechanical polymer (EMP) transducers of the present invention disclosed herein are electrostrictive, rather than piezoelectric. Some examples of the electromechanically active polymers incorporated in the EMP transducers of the present invention include P(VDF-TrFE) modified by either high energy density electron irradiation or by copolymerization with a third monomer. Such a modification lead to significant performance change; namely, the EMP loses its piezoelectric and ferroelectric behaviors and become an "electrostrictive" or "relaxor ferroelectric" material. The resulting EMP actuators respond to an imposed electric field by elongating in a direction perpendicular to the electric field, regardless of the field polarity. Typically, the EMP actuator of the present invention may generate a more than 1% strain under an electric field of 100 MV/m, which is significantly higher than the typical piezoelectric materials, such as lead zirconate titanate (PZT), a piezoelectric ceramic material.

The term "relaxor ferroelectric" is sometimes used with respect to EMPs to emphasize the absence of hysteresis in their strain response and their charge accumulation under an alternating current (AC) electric field. Therefore, the EMP transducers disclosed herein may also be referred to as "relaxor ferroelectric" or "electrostrictive" transducers. An electromechanical polymer (EMP) transducer typically includes an EMP layer that comprises an electrostrictive polymer active layer and electrodes bonded thereto. With the electrostrictive polymer active layer being less than 10 microns thick, the present invention provides EMP actuators that may be actuated at a low driving voltage (e.g., 300 volts or less; preferably, 150 volts or less) suitable for use in a wide variety of consumer electronic devices, such as mobile telephones, laptops, ultrabooks, and tablets.

When an external electric field is imposed across the EMP layer, the EMP layer becomes charged. The EMP layer thus behaves electrically as a capacitor. (The electric field also provides the electrostrictive response discussed above). The present invention provides EMP sensors that may be operated at a low charging voltage (e.g., 300 volts or less; preferably, 150 volts or less) suitable for use in a wide variety of consumer electronic devices, such as mobile telephones and tablets. In some embodiments, EMP sensors disclosed herein may also serve as EMP actuators.

Figure 3A:
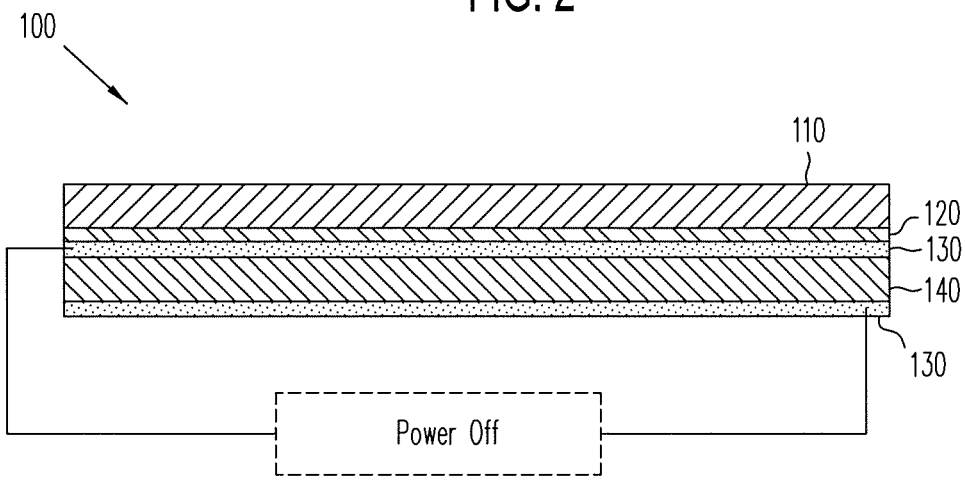
FIGS. 3(a) and 3(b) show, according to one embodiment of the present invention, single-layer EMP transducer 100 that includes single layer 140 of an electrostrictive polymer and two electrodes 130 deposited or bonded to opposite sides thereof.
Figure 3B:
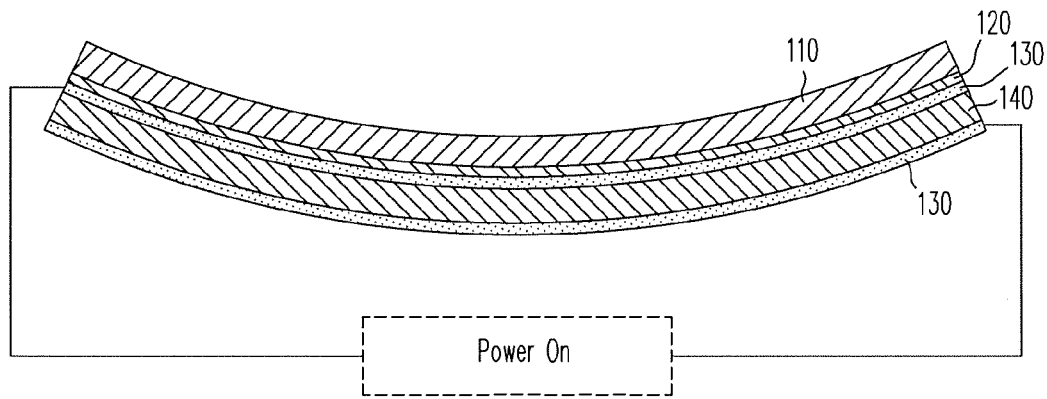

FIGS. 3(a) and 3(b) show, according to one embodiment of the present invention, single-layer EMP transducer 100 that includes a single EMP layer (i.e., EMP layer 140) of a relaxor ferroelectric fluoropolymer and two electrodes 130 deposited or bonded to opposite sides the single EMP layer. Passive substrate 110 is bonded to one side of EMP transducer 100 by adhesive 120. Alternatively, passive substrate 110 may be bonded to EMP transducer 100 by thermal lamination. EMP layer 140, electrodes 130 and adhesive 120 may have various thicknesses. For the applications disclosed in this detailed description, EMP layer 140 may be 0.1-10 um thick. Typically, EMP layer 140 may be about 1 um to about 7 um thick (e.g., 2-5 um thick), preferably about 3 um thick. EMP layer 140 need not have uniform thickness. Adhesive 120 may be up to about 0.5 μm thick. Although EMP layer 140 is shown in FIG. 3(a) as planar, EMP layer 140 may have any of a wide variety of non-planar shapes (e.g., cylindrical, spherical, or parabolic). Single layer transducer 100 of FIG. 3(a) illustrates a unimorph design, in which EMP transducer 100 elongates in one direction under an electrical voltage provided across its thickness, while substrate 110 does not change its dimension. As shown in FIG. 3(b), when a voltage is applied across EMP transducer 100—which is of a unimorph design—EMP layer 140 bends in a concave manner. By suitably positioning a number of EMP transducers that are independently controlled (e.g., in an array, on a grid, at one or more corners of a polygonal area, overlapping, or in any suitable organized manner), different shapes or surface morphologies can be achieved.

Figure 4:
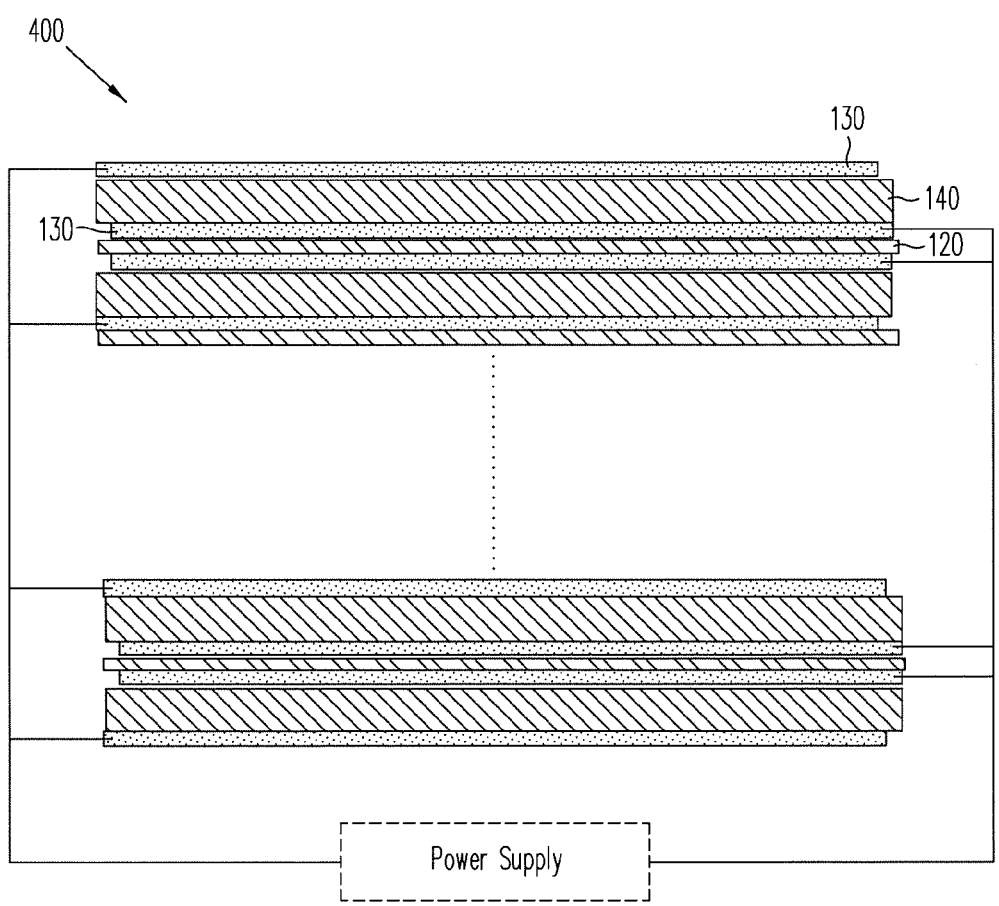
FIG. 4 shows multi-layer EMP transducer 400 that includes electrodes 130 on both sides of each EMP layer 140, according to one embodiment of the present invention.
Figure 5:
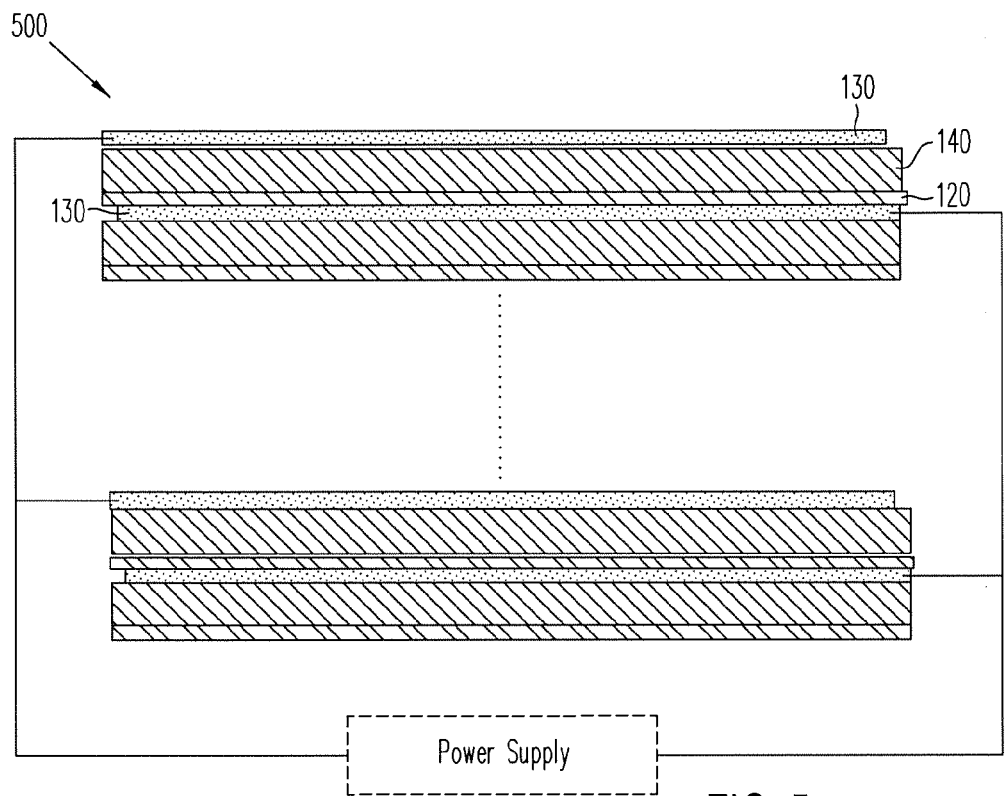
FIG. 5 shows multi-layer EMP transducer 500 that includes electrode 130 formed only on one side of each EMP layer 140, according to one embodiment of the present invention.
Figure 6:
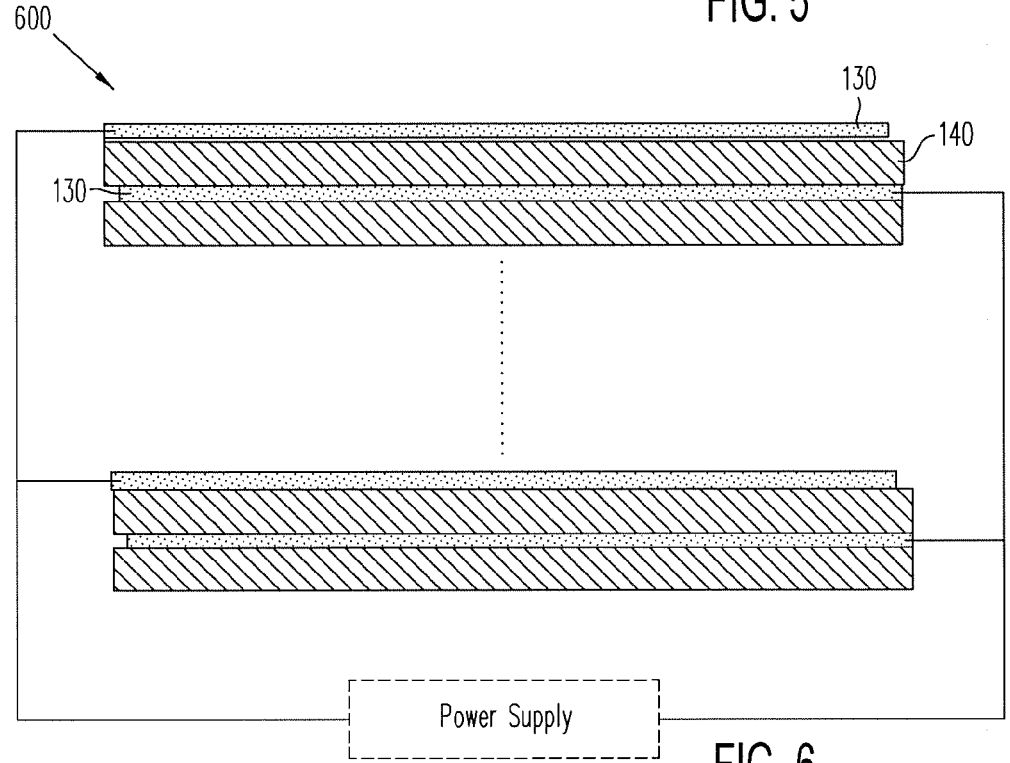
FIG. 6 shows multi-layer EMP transducer 600 that includes multiple units, each unit including EMP layer 140 and electrode 130, being thermally bonded together, according to one embodiment of the present invention.

According to a second embodiment of the present invention, an EMP transducer may include multiple electrostrictive polymer active layers and electrode layers configured in a stack to enable a cumulative force effect. The EMP layers and electrodes may be arranged so that the electrodes are electrically connected in parallel. FIGS. 4-6 show various configurations of multi-layer EMP transducers. The multiple EMP layers with electrodes may be bonded together by adhesive or by thermal lamination. Adjacent EMP layers may share an electrode. In some embodiments, the EMP layers may be 1-10 microns thick, formed out of 1-1000 single EMP layers.

Bimorph transducers can also be produced using the EMP layers with independently controlled electrodes. For example, two EMP transducers with independent controls and power supplies can be bonded together to form such a bimorph transducer. An optionally passive layer may be included between the two EMP transducers. When one of the EMP transducers ("first EMP transducer") is activated while the other EMP transducer ("second EMP transducer") is not, the bimorph device bends towards the second EMP transducer. On the other hand, when the second EMP transducer is activated, while the first EMP transducer is not activated, the bimorph device bends towards the first EMP transducer. Thus, a bimorph EMP transducer device can be controlled to bend in either direction.

FIG. 4 illustrates multi-layer EMP transducer 400 that includes electrodes 130 formed on both sides of each EMP layer 140, according to one embodiment of the present invention. Thus, multilayer EMP transducer 400 may be provided by stacking multiple single-layer EMP transducers, each exemplified, for example, by EMP transducer 100 of FIG. 3(a). It has been determined the stacked EMP transducers together provide a greater surface deformation than the surface deformation provided by a single-layer EMP transducer of the same total thickness. Adhesive 120 may be used to bond electrodes 130 of adjacent EMP transducers.

FIG. 5 illustrates multi-layer EMP transducer 500 that includes electrode 130 formed only on one side of each EMP layer 140, according to one embodiment of the present invention. As shown in FIG. 5, each EMP layer 140 is bonded by adhesive 120 to electrode 130 of an adjacent EMP layer 140.

FIG. 6 illustrates multi-layer EMP transducer 600 that includes multiple units, each unit including EMP layer 140 and electrode 130, being thermally bonded together, according to one embodiment of the present invention. The EMP layers may be the same or different. The EMP layers also may have the same or different thicknesses. The multilayer EMP actuator illustrated in FIG. 6 employs alternating layers of EMP layer 140 and electrode 130 thermally bonded to both sides of EMP layer 140.

EMP layer 140 of any EMP transducer discussed herein may be preprocessed (e.g., uniaxially or biaxially stretched, conventionally or otherwise, or having electrodes formed thereon) to condition the EMP layer's electromechanical response to an applied external field. A biaxially stretched actuator can deform in all directions in the plane of the axes of stretching, resulting in a dome-shaped deformation suitable for use as input keys or buttons, or braille text. A stretched EMP layer typically may be annealed at about 80° C. to about 130° C. When the EMP actuators are activated using a steady DC (i.e., 0 Hz), the surface can be deformed to provide a regular physical keyboard (e.g., a QWERTY keyboard). When a pressure sensor provided in the vicinity (e.g., a touch-sensing surface) detects that a specific key is pressed by a user, an excitation signal may be provided to cause the associated EMP actuator to vibrate, as a haptics response to confirm to the user that the user's typing action has been detected.

Electrodes 130 of any EMP transducers discussed herein may be formed using any suitable electrically conductive materials, such as transparent conducting materials (e.g., indium tin oxide (ITO) or transparent conducting composites, such as indium tin oxide nanoparticles embedded in a polymer matrix). Other suitable conductive materials include carbon nanotubes, graphenes, and conducting polymers. Electrodes 130 may also be formed by vacuum deposition or sputtering using metals and metal alloys (e.g., aluminum, silver, gold, or platinum). Nanowires that are not visible over a graphical display layer may also be used.

In some embodiments, the EMP transducers may be made transparent when transparent electrodes are used. Transparent EMP transducers can be used, for example, in conjunction with a display or touch surface (e.g., placed on top of the display or surface) without detriment to the performance of the display or touch surface. In other embodiments, using suitable electrodes, EMP transducers can be made semi-transparent. Such semi-transparent EMP transducers are suitable for use in applications which require certain level of light to be transmitted. One example of a suitable application for semi-transparent EMP transducers may be as keyboards with backlit light. In yet other embodiments, EMP transducers can be opaque. Such opaque EMP transducers may be used in applications where light transmission is not necessary.

Figure 29A:
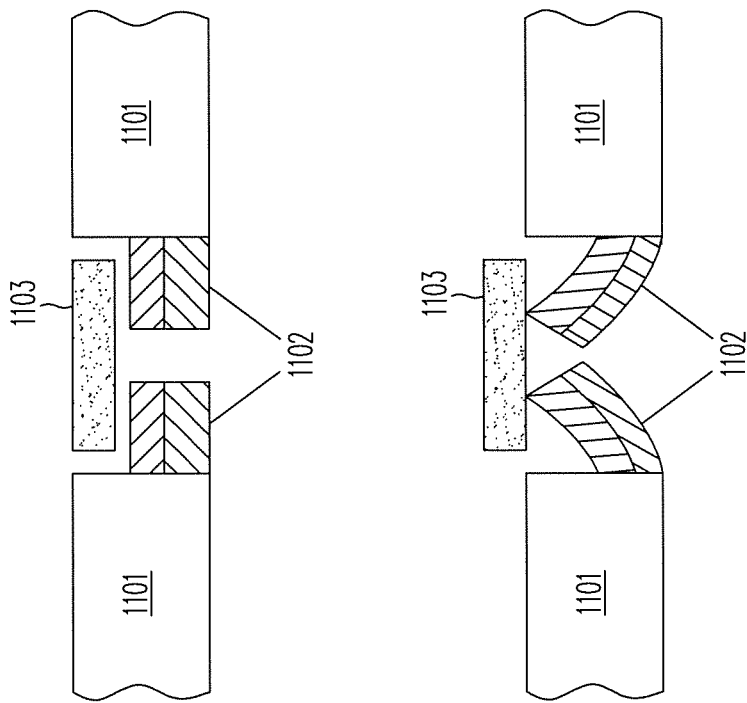
FIGS. 29(a) and 29(b) each show a suitable key movement mechanism of such an EMP actuated keyboard, in accordance with one embodiment of the present invention.
Figure 29B:
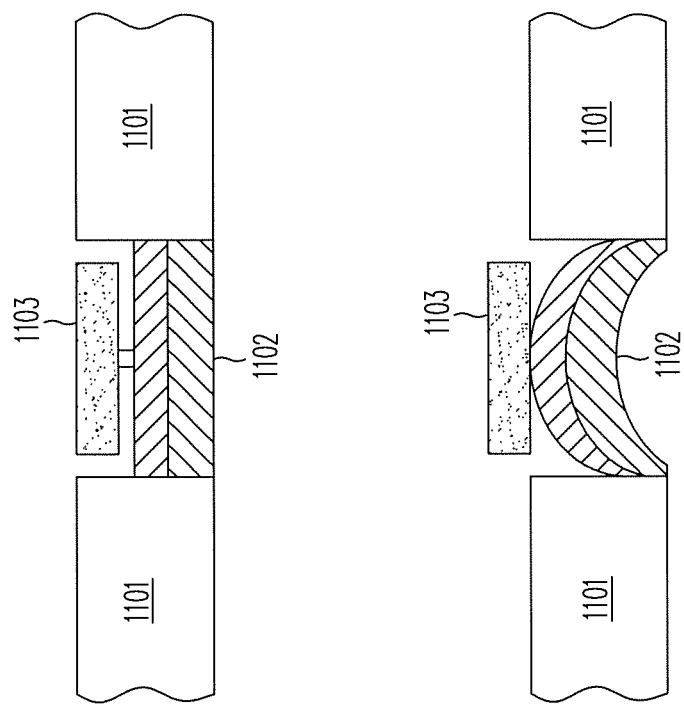

The present invention may be used to provide keyboards or other user interface devices in consumer electronics, which continue to become smaller and thinner. Low-profile, thin keyboards are desired for use with many information processing devices (e.g. tablet computers, ultrabook and MacBook Air). Because the EMP transducers of the present invention can be made very thin, according to one embodiment of the present invention, a keyboard based on EMP transducers may be provided which includes physical key movements in the manner of a conventional keyboard. FIGS. 29(a) and 29(b) each show a suitable key movement mechanism of such an EMP actuated keyboard, in accordance with one embodiment of the present invention. A haptic response may be provided as confirmation of receipt of the user's key activation in the user's typing. In this regard, the EMP actuators may replace the spring mechanism in a classical keyboard, enabling a low-profile thin keyboard, while still providing the desirable key travel distance in a conventional keyboard that a user expects. When at rest, keys in such a keyboard are recessed, with the EMP transducer being in a flat, quiescent position in the thin keyboard. Upon activation, which occurs when the keyboard is readied for typing, the EMP transducers are activated to lift each key by a distance of 0.1 mm to 10 mm. When a user presses a key, the pressure of the user's finger depresses the key against the EMP transducer, perhaps by a distance roughly equal to the distance of the activation lift, by overcoming the upward pressure in the activated transducer. In this manner, the key that is pressed travels the conventional key travel distance, as in a conventional keyboard. When the user releases the key, the activated EMP transducer returns to the lifted position, ready in its charged state for the next key press. Alternatively, an electrical voltage that is controlled by a controller may be provided on the EMP transducer to provide a predetermined force profile for an even richer user experience. As the EMP transducer has EMP active layers that are based on one or more dielectric electrostrictive polymers with high electrical resistance, such an EMP actuated keyboard requires little power, as power is dissipated only through tiny leakage currents.

As shown in FIG. 29(a), an EMP transducer 1102 is provided to support key or button 1103. EMP transducer 1102 is fixed to base structure or substrate 1101. Key 1103 may be mechanically connected to EMP actuator 1102 by a rigid pillar. FIG. 29(a) shows EMP transducer 1102 in a rest state (shown in the upper half of the figure) and in an activated state (shown in the lower half of the figure). In the rest state, EMP actuator 1102 is not activated. Upon activation by an electric field, i.e., when EMP transducer 1102 is in the activated state, EMP transducer 1102 pushes against fixed base structure 1101, bending to form a dome or bridge structure, thereby lifting key 1103. Since activated EMP transducer 1102 asserts a blocking force that is proportional to the applied electric field, when a user pushes key 1103 down with a force that is greater than the blocking force, key 1103 and EMP transducer 1102 travels downward, even though EMP transducer 1102 remains activated by the applied electric field. When the user lifts his finger, thereby releasing key 1103, EMP transducer 1102 and key 1103 automatically returns to the lifted position. For keyboard application, the EMP transducers may be further controlled by electric field to provide additional key travel.

FIG. 29(b) illustrates a second design using EMP transducers in a keyboard application. As shown in FIG. 29(b), two EMP transducers (collectively, EMP transducers 1102) lift key 1103 in the same manner as described above in conjunction with FIG. 29(a), except that only one end of each of EMP transducers 1102 is fixed to base structure or substrate 1101. In the rest position (shown in the upper half of FIG. 29(b)), i.e., EMP transducers 1102 are not activated, EMP transducers 1102 are flat and key 1103 is in a recessed position. Upon activation (shown in the lower half of FIG. 29(b)), i.e., when an electric field is applied across each of EMP transducers 1102, the free ends of EMP transducers 1102 bend upwards to lift key 1103. In this second design, two or more EMP transducers may be used to lift each key of the keyboard.

According to one embodiment of the present invention, the EMP actuators form on a deformable surface a refreshable braille display.

The EMPs suitable for use in components (e.g., EMP actuators employed in haptic substrates and haptic devices disclosed herein) typically show very high strain of about 1% or more under an electric field gradient of 100 megavolts per meter or greater. (Strain is measured as the change in length of an EMP layer as a percentage of the quiescent length.) The EMP layers also may show elastic modulus of about 500 MPa or more at 25° C., a mechanical vibrational energy density of 0.1 J/cm$^3$ or more, a dielectric loss of about 5% or less, a dielectric constant of about 20 or more, an operating temperature of about −20° C. to in about 50° C., and a response time of less than about 40 millisecond.

Suitable electrostrictive polymers for EMP layers 140 include irradiated copolymers and semi-crystalline terpolymers, such as those disclosed in U.S. Pat. Nos. 6,423,412, 6,605,246, and 6,787,238. Suitable irradiated copolymers may include high energy electron irradiated P(VDF$_x$-TrFE$_{1-x}$) copolymers, where the value of x may vary between 0.5 to 0.75. Other suitable copolymers may include copolymers of P(VDF$_{1-x}$CTFE$_x$) or P(VDF$_{1-x}$HFP$_x$), where the value of x is in the range between 0.03 and 0.15 (in molar). Suitable terpolymers that may have the general form of P(VDF$_x$-2nd monomer$_y$-3rd monomer$_{1-x-y}$), where the value of x may be in the range between 0.5 and 0.75, and the value of y may be in the range between 0.2 and 0.45. Other suitable terpolymers may include P(VDF$_x$-TrFE$_y$-CFE$_{1-x-y}$) (VDF: vinylidene fluoride, CFE: chlorofluoroethylene, where x and y are monomer content in molar), P(VDF$_x$-TrFE$_y$-CTFE$_{1-x-y}$) (CTFE: chlorotrifluoroethylene), poly(vinylidene fluoride-trifluoroethylene-vinylidene chloride)(P(VDF-TrFE-VC)), where x and y are as above; poly(vinylidene fluoride-tetrafluoroethylene-chlorotrifluoroethylene)(P(VDF-TFE-CTFE)), poly(vinylidene fluoride-trifluoroethylene-hexafluoropropylene), poly(vinylidene fluoride-tetrafluoroethylene-hexafluoropropylene), poly(vinylidene fluoride trifluoroethylene-tetrafluoroethylene), poly(vinylidene fluoride tetrafluoroethylene tetrafluoroethylene), poly(vinylidene fluoride-tri fluoroethylene-vinyl fluoride), poly(vinylideneflouride-tetrafluoroethylene-vinyl fluoride), poly(vinylidene flouride-trifluoroethyleneperfluoro(methyl vinyl ether)), poly(vinylidene fluoride-tetrafluoroethylene-perfluoro (methyl vinyl ether)), poly(vinylidene fluoride-trifluoroethylene-brom otrifluoroethylene, polyvinylidene), poly(vinylidene fluoride-tetrafluoroethylene-chlorofluoroethylene), poly(vinylidene fluoride-trifluoroethylene-vinylidene chloride), and poly(vinylidene fluoride tetrafluoroethylene vinylidene chloride), Furthermore, a suitable EMP may be in the form of a polymer blend. Examples of polymer blends include of polymer blends of the terpolymer described above with any other polymers. One example includes the blend of P(VDF-TrFE-CFE) with P(VDF-TrFE) or blend of P(VDF-TrFE-CTFE) with P(VDF-TrFE). Other examples of suitable polymer blends include a blend of P(VDF-TrFE-CFE) with PVDF or a blend of P(VDF-TrFE-CTFE) with PVDF. Irradiated P(VDF-TrFE) EMP may be prepared using polymeric material that is itself already a polymer blend before irradiation.

Figure 1:
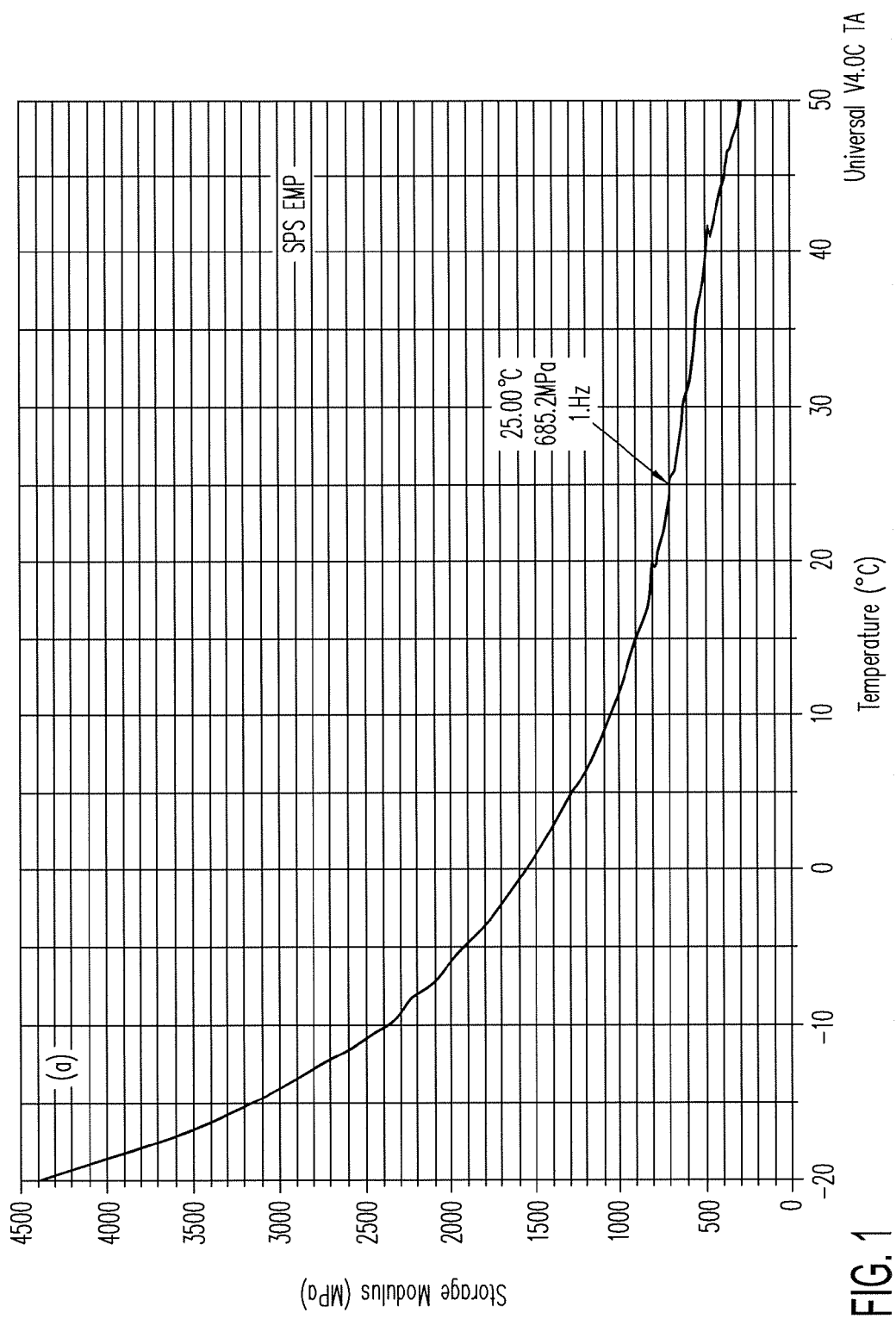
FIG. 1 shows storage modulus of a stretched film, as measured using a dynamic mechanical analyzer at 1 Hz over a temperature range of −20° C. to 50° C.

According to one embodiment of the present invention, to form a EMP layer, P (VDF-TrFE-CFE) polymer powder was dissolved in N, N-dimethylformamide (DMF) solvent at 5 wt. % concentration. The solution was then filtered and cast onto a glass slide to produce a 30 μm thick film. The film was then uniaxially stretched by 700% (i.e., the final film length equals to 700% of the cast film length), resulting in 5 μm thick film. The stretched 5 μm in thick film was further annealed in a forced air oven at 110° C. for two hours. FIG. 1 shows storage modulus of the resulting stretched film, as measured using a dynamic mechanical analyzer (e.g., DMA, TA DMA 2980 instrument) at 1 Hz over a temperature range of −20° C. to 50° C. As shown in FIG. 1, the stretched polymer film has a storage modulus of 685.2 MPa at 25° C. Thus, an EMP actuator may be made by casting a layer of EMP polymer (e.g., a P(VDF-TrFE-CFE) or P(VDF-TrFE-CTFE) terpolymer). Such a film may be stretched and annealed at about 80 to about 130° C.

Figure 2:
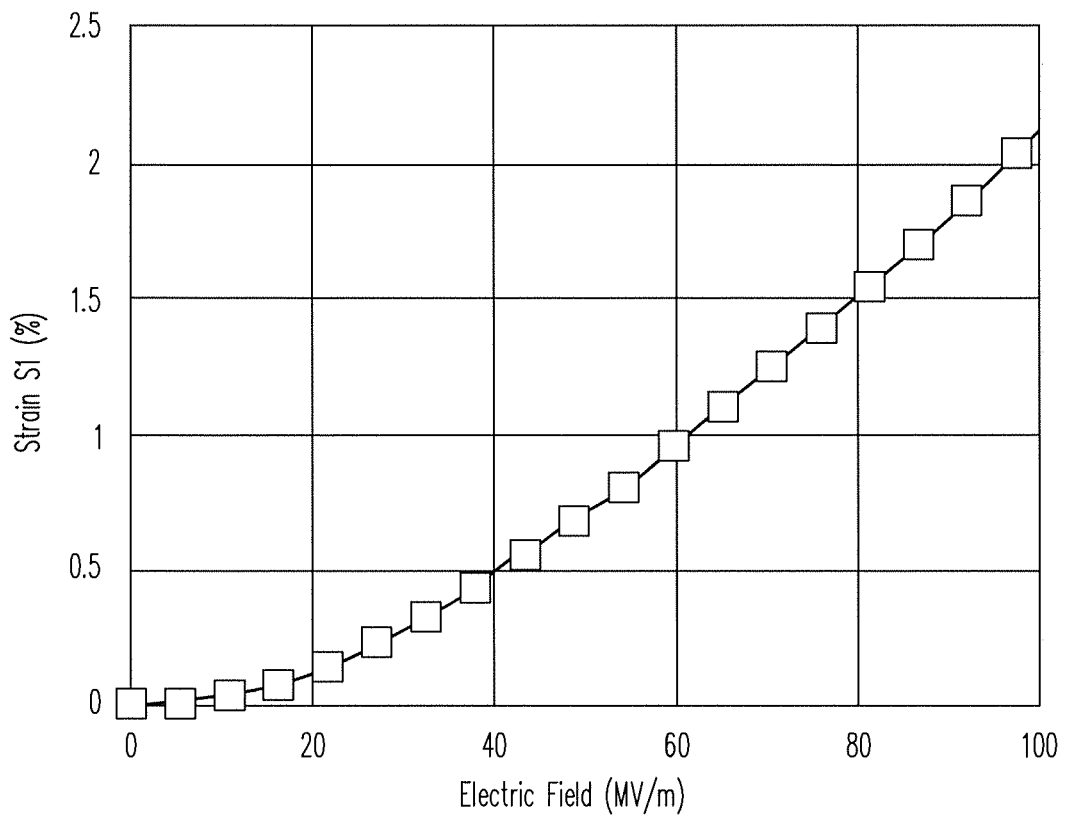
FIG. 2 shows the strain $S_1$ of an EMP actuator with a stretched EMP film, as measured in the stretching direction, as a function of the applied voltage.

The stretched EMP film of FIG. 1 was metallized by sputtering 30 nm thick gold layers on both sides of the film. Various voltages were applied to the resulting EMP actuator and the changes in film length in the direction parallel to stretching were measured. FIG. 2 shows strain S$_1$ of the EMP actuator in the stretching direction, as a function of the applied voltage. As shown in FIG. 2, the stretched EMP film has strain S$_1$ of 0.48% at 40 MV/m and 2.1% at 100 MV/m.

An EMP transducer of the present invention may also generate a temperature change through the electrocaloric effect described, for example, in the article "Large Electrocaloric Effect in Ferroelectric Polymers Near Room Temperature," by Neese, et al, published on *Science*, Vol. 321 no. 5890 pp. 821-823, 2008. The electrocaloric effect may be exploited to generate a cooling or heating effect to a user in a tactile system. In such an application, when an electric field is applied across an EMP transducer, the temperature of the EMP transducer increases due to a reduced entropy. Conversely, when the electric field is reduced or turned off, the temperature of the EMP transducer decreases due to increased entropy. Thus, the EMP transducer of the present invention may serve as both an actuator and a cooling device at the same time. The cooling effect may be utilized to provide the user special tactile feedback.

Some EMP transducers exhibit a pyroelectric effect that can be used to sense temperature change. In such an EMP transducer, a change in transducer or environment temperature results in a change in a dimension in the EMP transducer. The resulting change in its capacitance may be measured electrically (e.g., an electrical current or a change in voltage resulting from the change in electric charge).

Table 1 shows the performance of actuators made with modified, P(VDF-TrFE)-based EMP ('EMP"), dielectric elastomer and piezoceramics.

| Property | EMP | Elastomer DEAP | Piezoceramics (PZT 5H) |
|---|---|---|---|
| Strain (Stretching Direction) | 2.0% at 100 V/μm | 5-10% at 100 V/μm | 0.1% at 2 V/μm |
| Young's Modulus (MPa) | >500 | ~1 | ~100,000 |
| Vibration Mechanical Energy Density (J/cm$^3$) | >0.1 | ~0.005 | ~0.05 |

-continued

| Property | EMP | Elastomer DEAP | Piezoceramics (PZT 5H) |
|---|---|---|---|
| Dielectric Constant | 35 | 3 | 2500 |
| Dielectric Loss (%) | 5 | 5 | 2 |
| Minimal Film Thickness (μm) | 3 | 18 | 50 |
| Voltage for Listed Strain | 300 | 1800 | 100 |
| Operating Temperature | −20° C.~50° C. | −20° C.~50° C. | −50° C.~100° C. |
| Response Time (ms) | <1 | <10 | <0.1 |

As shown in Table 1, an EMP layer made with modified, P(VDF-TrFE)-based EMP has balanced electromechanical response and mechanical modulus. The output vibration mechanical energy density of such an EMP layer is also significantly higher than the elastomer DEAP and piezoceramic actuators.

Figure 7:
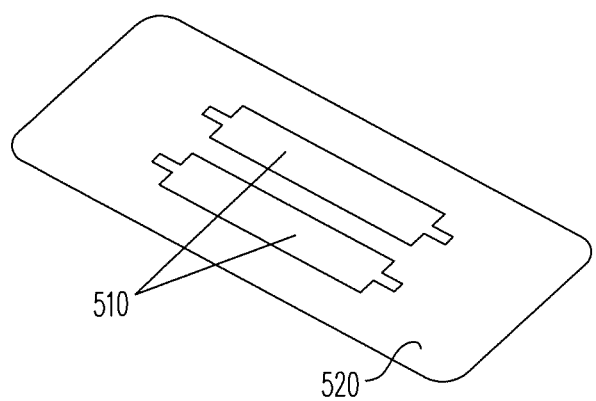
FIG. 7 shows EMP actuators 512 forming a 1×2 array bonded to substrate 520.
Figure 8:
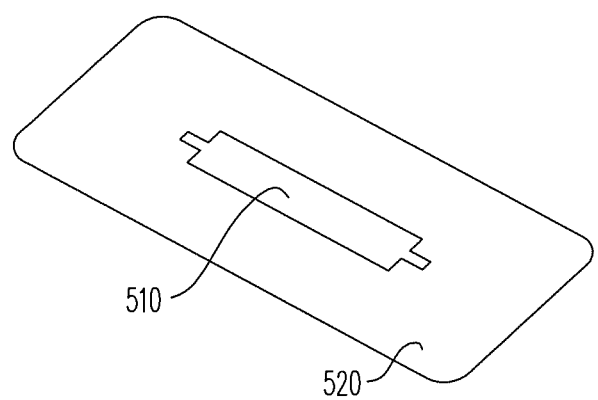
FIG. 8 shows single EMP actuator 510 bonded to substrate 520.
Figure 9:
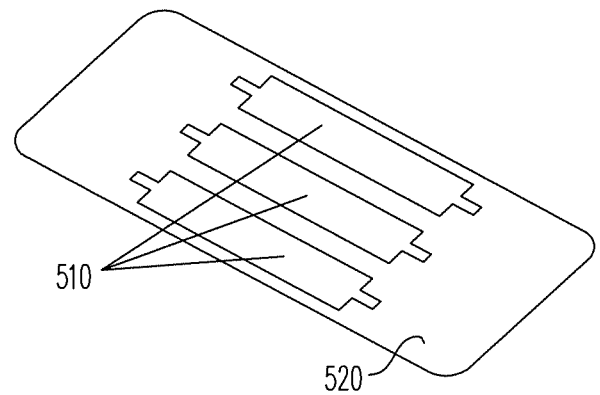
FIG. 9 shows a 1×3 array of actuators 510 bonded to substrate 520.
Figure 10:
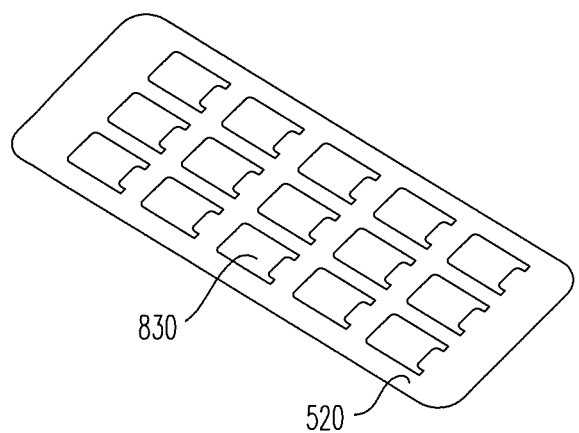
FIG. 10 shows 15 EMP actuators 830 in 5 by 3 array bonded to substrate 520.
Figure 11:
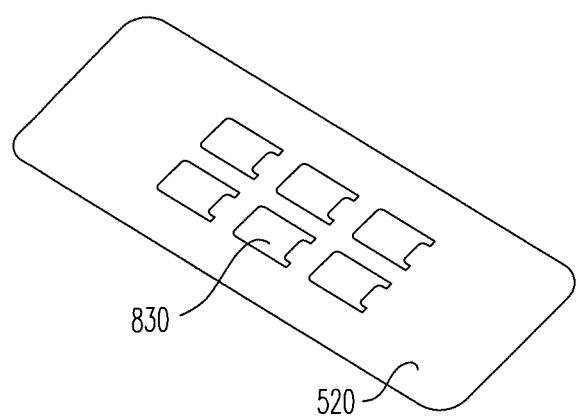
FIG. 11 shows six EMP actuators 830 in a 3 by 2 array bonded to substrate 520.

FIGS. 7-11 show EMP actuators bonded on a substrate in various configurations suitable for use in forming haptic surfaces in consumer electronic devices. A haptic surface may be formed by bonding one or more EMP actuators to a substrate that is part of or placed on a sensing surface (e.g., a touch screen) of an electronic device, and connecting electrical conductors to each EMP actuator to a voltage source controlled by the electronic device. As each EMP actuator may have a very small footprint, the haptic response provided may be localized to the area of the small footprint. The haptic surface thus allows the electronic device to respond to a user's input stimulation at a sensing surface by providing "localized" haptic feedback, i.e., precisely at the point of input stimulation. As shown in FIG. 7, EMP actuators 512 in a 1×2 array is bonded (e.g., by adhesive) to substrate 520. FIG. 8 shows single EMP actuator 510 bonded to substrate 520. FIG. 9 shows a 1×3 array of actuators 510 bonded to substrate 520. FIG. 10 shows 15 EMP actuators 830 in 5 by 3 array bonded to substrate 520. FIG. 11 shows six EMP actuators 830 in a 3 by 2 array bonded to substrate 520.

The sensing surface may be provided, for example, on a graphical display layer, such as typically in a mobile telephone. In these arrangements, each EMP actuator may be actuated independently or in concert with other EMP actuators. As explained below, the EMP actuators may excite structural modes of the haptic surface within a desired haptic frequency band. Also, the EMP actuators may be arranged to operate as a phased array to focus haptic feedback to a desired location. In one embodiment, the EMP actuators may be laminated on a thin glass or plastic substrate that is less than 1,000 μm thick. Such a haptic surface is sufficiently thin to effectively transmit a haptic event without significantly attenuating the actuator output. Suitable substrate materials include transparent materials such as glass, polycarbonate, polyethylene terephthalate (PET), polymethyl methacrylate, polyethylene naphthalate (PEN), opaque material such as molded plastic, or mixtures thereof. Other suitable substrate materials include multi-component functional sheets such LCD, OLED, PET and combinations thereof.

The EMP transducers may be provided a coating on the top surface or the bottom surface as an electrical insulation layer, as a force receiving layer, or as a protection layer (e.g., to protect from exposure moisture, water or air). The coating may be scratch-resistant, for example, for durability. The coating may be a plastic formed by applying a wet-coating or lamination, or an inorganic layer formed by vapor deposition. Examples of a suitable coating layer include silicone, silicon oxide, silicon nitride, fluoropolymers, acrylates, and PET.

The substrate, the EMP actuators and the electrical connectors typically are sufficiently flexible to be assembled into a haptic surface by the well known roll-to-roll manufacturing process. In the "roll-to-roll" process, the steps of a manufacturing process are performed on a continuous moving belt that originates from a feed reel.

EMP actuators disclosed herein may be actuated by low driving voltages of less than about 300 volts (e.g., less than about 150 volts). These driving voltages typically may generate an electric field of about 40 V/μm or more in the EMP layer of the EMP actuator. The EMP actuators may be driven by a voltage sufficient to generate an electric field that has a DC offset voltage of greater than about 10 μm, with an alternating component of peak-to-peak voltage of less than 300 volts. (The excitation signal need not be single-frequency; in fact, an excitation signal consisting simultaneously of two or more distinct frequencies may be provided.) The EMP actuators disclosed herein provide a haptic vibration of substantially the same frequency of frequencies as the driving voltage. When the driving voltages are in the audio range (e.g., up to 40,000 Hz, preferably 400-10000 Hz), audible sounds of substantially those in the driving frequency or frequencies may be generated. These EMP actuators are capable of switching between frequencies within about 40 ms, and are thus suitable for use in HD haptics and audio speaker applications. The EMP actuators are flexible and can undergo significant movement to generate high electrostrictive strains. Typically, a surface deformation application would use excitation frequencies in the range between 0-50 Hz, a localized haptic application would use excitation frequencies in the range between 50-400 Hz, and an audio application would use excitation frequencies in the range between 400-10,000 Hz, for example.

When driven under an AC signal, the waveform may be triangular, sinusoid, or any arbitrary waveform. In fact, the waveform can be customized to generate any specific, desired tactile feedback. For example, the frequency of the waveform can be the same throughout the duration of a haptics event, or may be continuously changed. The waveform or the amplitude of the AC signal can also be the same throughout the haptics event, or continuously changed.

Figure 12:
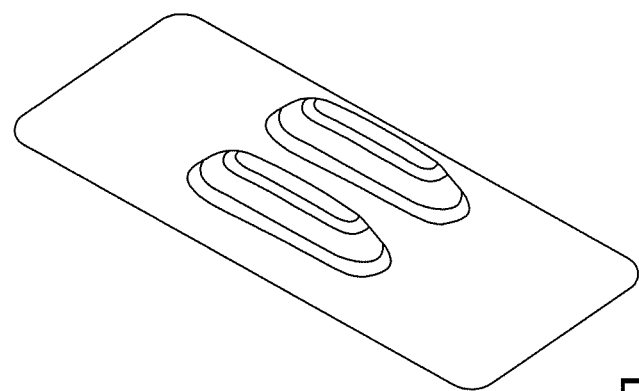
FIG. 12 shows the haptic responses of EMP actuators 510 of FIG. 7.
Figure 13:
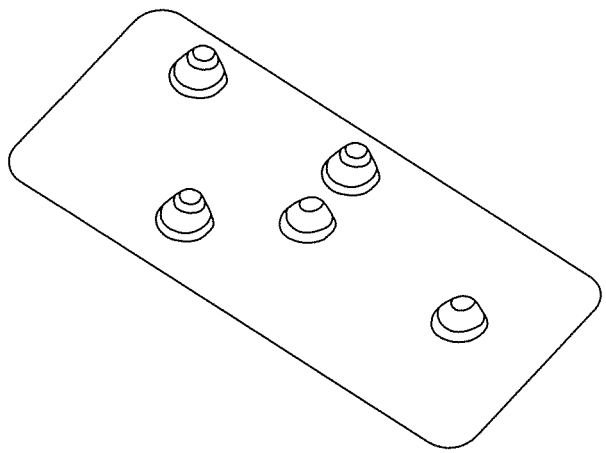
FIG. 13 shows the haptic responses in 5 EMP actuators 830 configured in the 5 by 3 array of FIG. 10, in accordance with one embodiment of the present invention.
Figure 14:
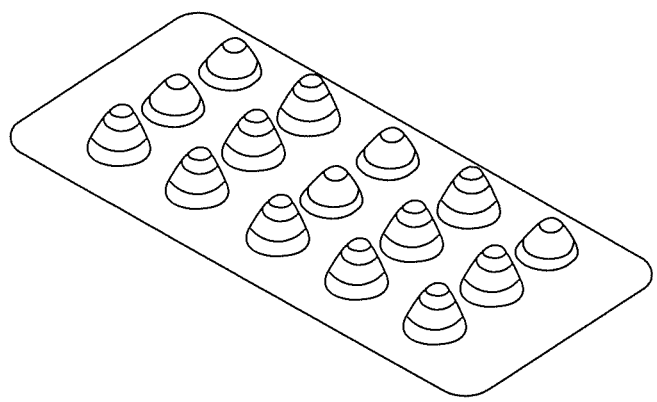
FIG. 14 shows haptic responses of all 15 EMP actuators 830 in the 5×3 array of FIG. 10, in accordance with one embodiment of the present invention.

FIGS. 12-14 illustrate the haptic responses in EMP actuators disclosed herein. For example, FIG. 12 shows the haptic responses of EMP actuators 510 of FIG. 7. As shown in FIG. 12, substrate 520 deflects locally as EMP actuators 510 actuate in an extensional manner. EMP actuators 520 may be controlled separately to maximize haptic output and to provide tailored haptic response to the user.

FIG. 13 shows the haptic responses in five of EMP actuators 830, configured in the 5 by 3 array of FIG. 10. As shown in FIG. 13, substrate 520 locally deflects as EMP actuators 830 actuate in an extensional manner. Note that, each EMP actuator may be activated to deform the substrate on which it is situated to form an input key or button. Likewise, FIG. 14 shows haptic responses of all 15 EMP actuators 830 in the 5×3 array of FIG. 10.

The EMP actuators disclosed herein have typical latency rise time (i.e., the time between the EMP actuator receiving its activating input signal to the EMP actuator providing the mechanical haptic response) from less than about 5 milliseconds up to about 40 milliseconds. The EMP actuators have a typical decay time (i.e., the time between the EMP actuator receiving the cessation of the activating input signal to the EMP actuator's haptic response falling below the user's detectable threshold) from less than about 5 milliseconds up to about 40 milliseconds. The EMP actuators typically have an acceleration response of greater than about 0.5 G to about 2.5 G over a frequency range of about 100 Hz to about 300 Hz.

Figure 15:
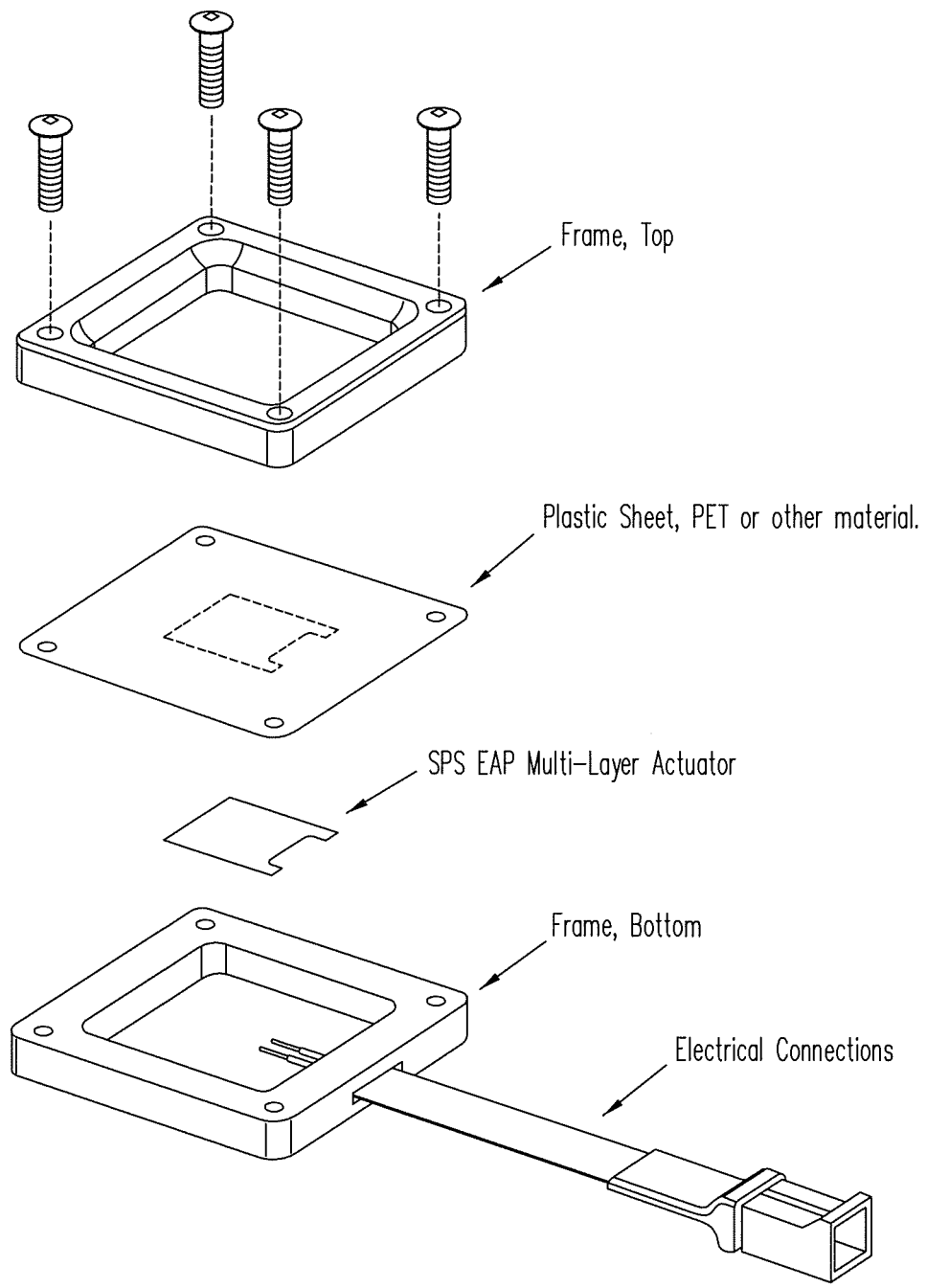
FIG. 15 shows multi-layer EMP actuator 1500 being bonded by an acrylate adhesive to a 250 μm thick polyethylene terephthalate (PET) film substrate, according to one embodiment of the present invention.

FIG. 15 shows multi-layer EMP actuator 1501 being bonded by acrylate adhesive to a 250 μm thick polyethylene terephthalate (PET) film substrate 1502, according to one embodiment of the present invention. As shown in FIG. 15, PET film substrate 1502 is suspended in an open cavity between frame bottom 1503 and frame top 1504, secured by four bolts 1505-1 to 1505-5 to provide a single-layer haptic surface. Electrical connection 1506 allows a voltage to be supplied to EMP actuator 1501.

FIG. 16 shows multi-layer EMP actuators 1600, arranged in a 3×2 array, being adhesively bonded to PET substrate 1601, in accordance with one embodiment of the present invention. Each multilayer EMP actuator may be formed, for example, by bonding together twenty 5 μm-thick, single-layer EMP actuators using acrylate adhesives. (Generally, a thinner EMP film layer requires a lesser driving electric field.) At a peak input voltage of 200 V, a multi-layer actuator in the array may achieve a peak accelerations of greater than 4 G at a frequency within the frequency range between 125 Hz and 400 Hz. Over the same range, the average acceleration would be greater than 1 G. FIG. 16 also shows the acceleration of each of multi-layer actuators 1600, measured as a function of input signal frequency, using a shear accelerometer (e.g., Model 352C65, PCB Piezotronics) at 25° C.

Figure 20A:
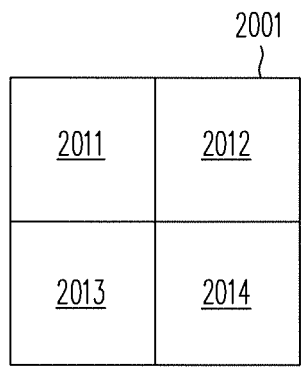
FIGS. 20(a)-(c) illustrate the effect of stacking EMP actuators of different thicknesses and sizes, in accordance with one embodiment of the present invention.
Figure 20B:
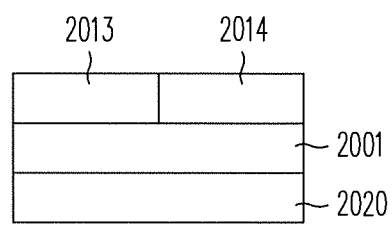
Figure 20C:
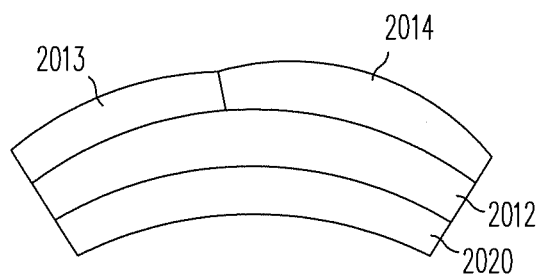

FIGS. 20(a)-(c) illustrate the effect of stacking EMP actuators of different sizes and thicknesses, in accordance with one embodiment of the present invention. FIGS. 20(a) and 20(b) are show the top and side views of an exemplary stack 2000 of EMP actuators. As shown in FIGS. 20(a) and 20(b), exemplary stack 2000 includes substrate 2020, a stronger, larger EMP actuator 2001 and four smaller top EMP actuators 2011-2014. EMP actuators 2001 and 2011-2014 are each independently controlled. FIG. 20(c) show a side view of exemplary stack 2000 when EMP actuators 2001 and 2014 are activated, while 2013 is kept at its quiescent length. Constrained by substrate 2020, the elongations of actuators 2001 and 2014 render them convex. In particular, EMP actuator 2014 pulls the portions of EMP actuator 2001 and substrate 2020 underneath it further upward, such that the side of stack 2000 containing EMP actuator 2014 reaches a greater height than the portion of stack 2000 including EMP actuator 2013. Thus, as shown in FIG. 20(c), the surface morphology of exemplary stack 2000 can be modified in several ways by selectively activating EMP actuators 2001 and 2011-2014. In a practical application, the stack of EMP actuators may be many layers, with smaller and weaker EMP actuators being provided as one goes up the stack. Also, although exemplary stack 2000 shows EMP actuators of substantially the same thickness, each layer of EMP actuators may have a different thickness from EMP actuators of other layers. By selectively activating the EMP actuators in such a stack, a large number of deformations may be achieved. For a deformation application, different surface morphologies can be achieved (e.g., circular or "square" domes). For a haptic application, the large number of deformations that can be achieved provide a large number of nuances in the resulting haptic response. Such nuances can be exploited to communicate different messages to the user according to the difference sensations in the resulting experience. One example is related to use the deformable surface to provide a graphical display.

A new audio speaker application is achieved by providing a number of individually controlled EMP actuators positioned according to a pre-determined configuration (e.g., in a regular array, as in FIGS. 7-11 above, or in even greater number in any configuration). As the EMP actuators are individually activated, the EMP actuators can provide a large number of audio speakers in close proximity. Such audio speakers can be excited together to provide audio volume over a large dynamic range, or they can be excited selectively and with different excitation signals to provide very complex sound reproduction.

Figure 17:
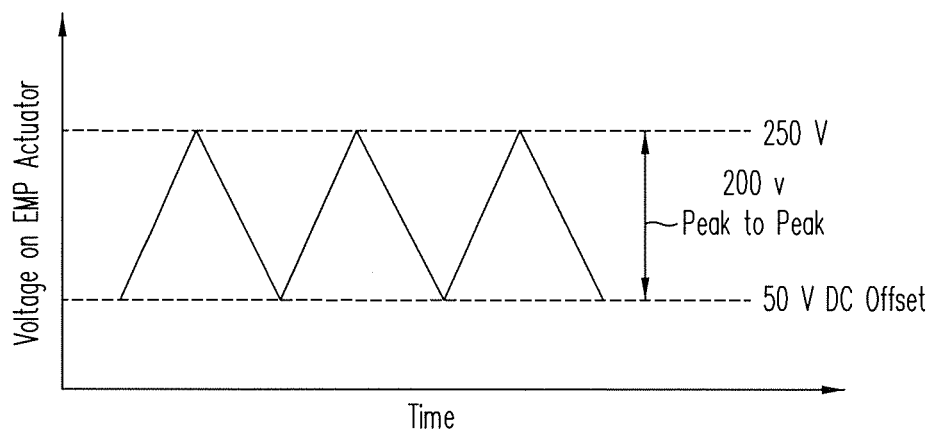
FIG. 17 shows the triangular waveform of a driving electric field on a multi-layer EMP actuator; the driving electric field has a 50 V DC offset voltage and a 200 V peak-to-peak voltage.
Figure 18:
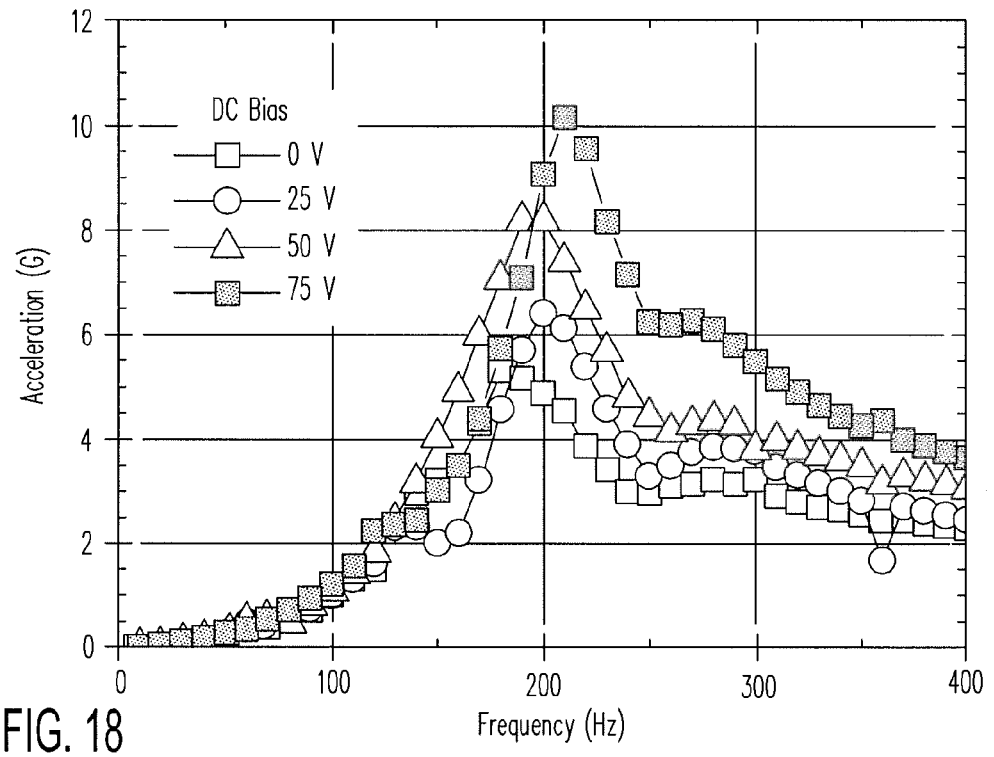
FIG. 18 shows the output accelerations of a multi-layer EMP actuator under DC-offset voltages of 0 volts, 25 volts, 50 volts and 75 volts.

According to one embodiment of the present invention, multi-layer EMP actuators in a 5×2 array, each comprising ten single-layer actuators, are measured for their respective accelerations, using a triangular voltage varying over 0-200 volts (peak-to-peak) with a DC-bias or offset voltage. A DC offset voltage increases both acceleration and electromechanical strain. FIG. 17 shows the triangular waveform of the driving electric field on a multi-layer EMP actuator; the driving electric field has a 50 V DC offset voltage and a 200 V peak-to-peak voltage. The output accelerations of a multi-layer EMP actuator within the 5×2 array under DC-offset voltages of 0 volts, 25 volts, 50 volts and 75 volts are shown in FIG. 18. As shown in FIG. 18, a 25 volt DC offset voltage increases the peak acceleration to 6.3 G. The increased acceleration becomes significant for DC offset voltages exceeding 50 volts (i.e., 10 V/μm). In the multilayer EMP actuator of FIG. 18, the peak acceleration increases from 5.5 G to 10 G as the DC-offset voltage increases from 0 volts to 75 volts.

Figure 19:
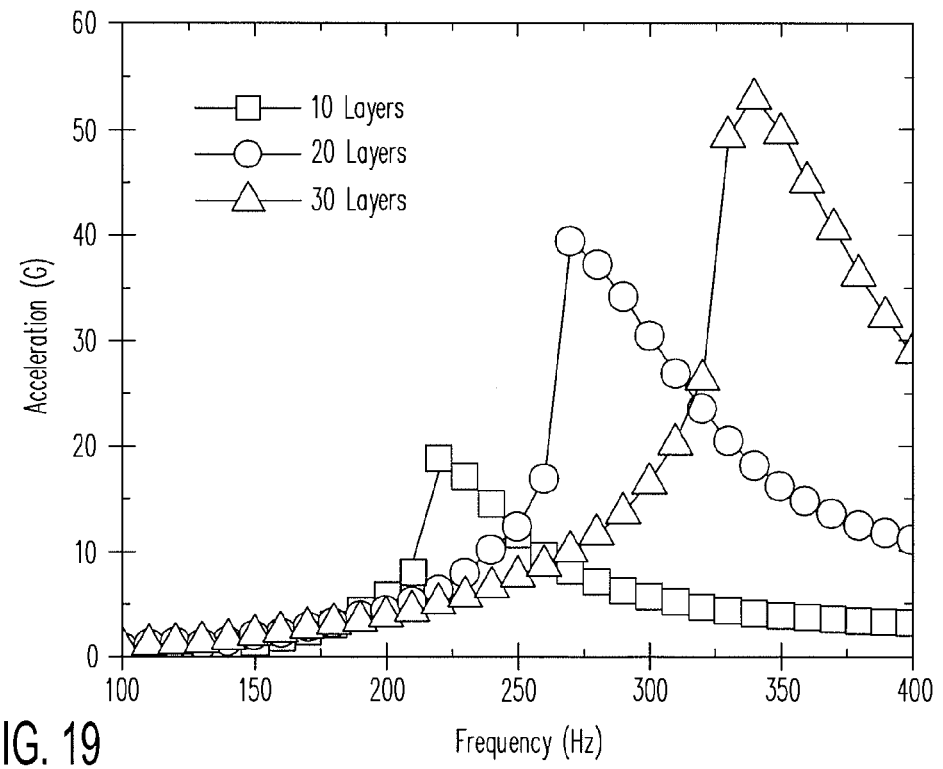
FIG. 19 shows surface accelerations for multi-layer actuators comprising different number of component EMP layers, as a function of input signal frequency.

FIG. 19 shows surface accelerations for multi-layer actuators comprising different number of component EMP layers, as a function of input signal frequency. In the multi-layer actuators of FIG. 19, each component EMP layer is 5 μm thick. As shown in FIG. 19, at a driving voltage of 200 volts, the surface acceleration increases from about 18 G, for a ten-layer EMP actuator, to 39 G and 53 G, for a 20-layer multi-layer EMP actuator and 30-layer multi-layer EMP actuator, respectively.

An EMP transducer can also be fabricated in fabrics that can be provided in items of clothing. Such EMP transducer thus may provide clothing with multimodal functions.

Because of their flexibility and their ease in manufacturing, EMP transducers can be made very small even on a consumer device (e.g., the touch surface of a cellular telephone). As a result, tactile feedback in response to touch by a human finger may be localized to an area in the immediate vicinity of the touch stimulus, thereby offering a stronger sensation and a finer resolution. This ability to concentrate the tactile feedback to a localized zone under the user finger can also reduce the device's power requirement, as the action required may be confined to a small zone associated with the finger, without involving the entire device.

According to one embodiment of the present invention, two or more EMP actuators may be driven simultaneously, each with a varying phase and amplitude in the driving signal. Such an arrangement may create haptic responses that take advantage of, for example, constructive interference. Thus, EMP actuators may be strategically located to provide an optimized, localized haptic event, based on the additive nature of haptic responses. This technique of haptic event delivery relies on analysis of the dynamics of the touch surface, taking into account damping, wave dispersion and other effects. Furthermore, according to one embodiment of the present invention, a touch surface can be driven at frequencies that correspond to the resonant modes of the touch surface. A driving frequency corresponding to a resonant mode creates a standing surface mode of vibration with points of maximum displacement (i.e., anti-nodes) and no displacement (i.e., nodes). By identifying the location where a user provides an input stimulus (e.g., where the user's finger touches the touch surface) and sensing the strength of the stimulus, if appropriate, a library of predetermined mode shapes may be searched for the driving mode which provides the appropriate response (e.g., the largest anti-node at the position of touch).

Therefore, according to one embodiment of the present invention, a haptic system may integrate one or more EMP actuators, control circuit and software. Application software may have access to such a haptic system through an application program interface. In some haptic systems, customized electronics, such as a power amplifier, may be provided to drive the EMP actuators. In handheld devices, the power amplifier relies on a regulated power source (e.g., a regulated 3 volts power supply) as power source.

Figure 21A:
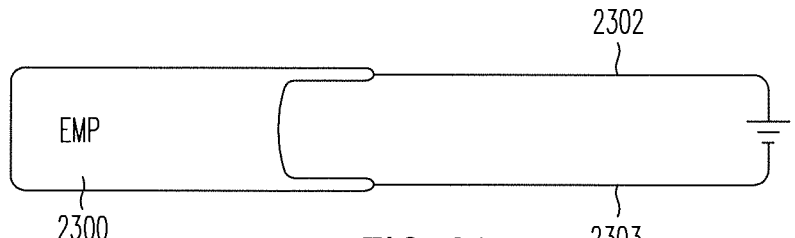
FIGS. 21(a) and 21(b) shows conceptually how an EMP sensor operates, according to one embodiment of the present invention.
Figure 21B:
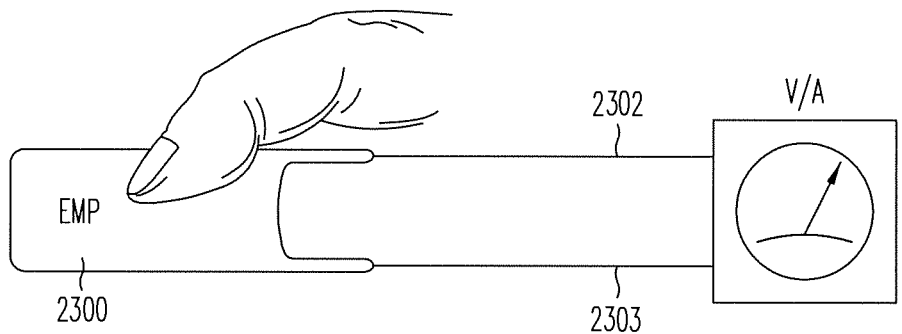

FIGS. 21(a) and 21(b) shows conceptually how an EMP sensor operates, according to one embodiment of the present invention. As shown in FIG. 21(a) EMP sensor 2300 is preferably initially charged by a power source or power supply. After EMP sensor 2300 is charged, charge is stored in the EMP layer or layers of EMP sensor 2300. In the charged state, a contact with EMP sensor 2300 or an application a mechanical force on EMP sensor 2300 would alter the capacitance of the EMP layer (e.g., as shown in FIG. 21(b)) and result in a measurable voltage across (or a current flowing through) leads 2302 and 2303 of EMP sensor 2300. Although not expressly shown in FIGS. 21(a) and 21(b), it is understood that EMP sensor 2300 provides a surface that transmits an externally imposed mechanical force to the EMP layers of EMP sensor 2300. In the EMP sensors described above, the measurable voltage may be as high as a few volts (e.g. 1-5 volts), making such EMP sensors desirable for use in many applications (e.g., portable computational devices, such smart telephones and tablet computers). Charging of the EMP sensor is not required in theory. However, without charging, a very sensitive circuit that can measure minute changes in capacitance in the EMP sensor (e.g., sensitive to changes in the order of microvolts) would then be required. In another embodiment, the EMP sensor may be charged before being installed in a final device. In some applications, such an EMP sensor may maintain its charge, and hence its sensor performance, without being charged again in its lifetime.

Figure 22A:
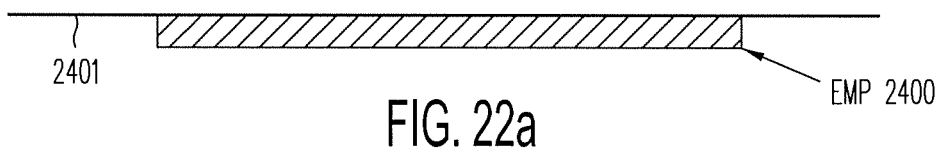
FIGS. 22(a) and 22(b) show EMP sensor 2400 provided on the surface of thin compliant film 401 (e.g., a thin aluminum or steel film), in accordance with one embodiment of the present invention.
Figure 22B:
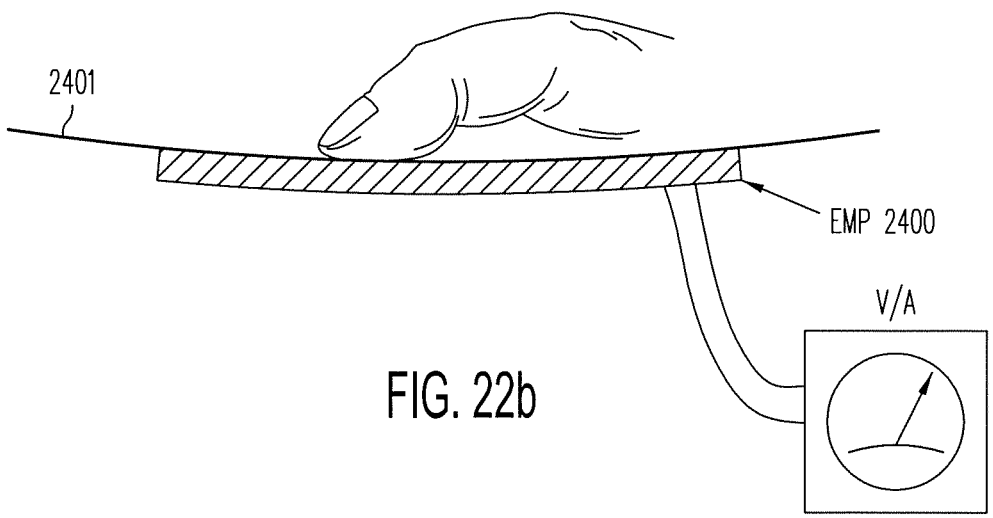

FIGS. 22(a) and 22(b) show EMP sensor 2400 provided on the surface of thin compliant film 2401 (e.g., a thin aluminum or steel film), in accordance with one embodiment of the present invention. As shown in FIG. 22(a), EMP sensor 2400 is preferably charged by a voltage supply to a quiescent state. As shown in FIG. 22(b), when a force is applied on thin compliant film 2401, the change in shape in compliant film 2401 stretches the EMP layer or layers within EMP sensor 2400, thereby altering the capacitance of those EMP layers, resulting in a measurable voltage or current output from EMP sensor 2400.

Figure 23A:
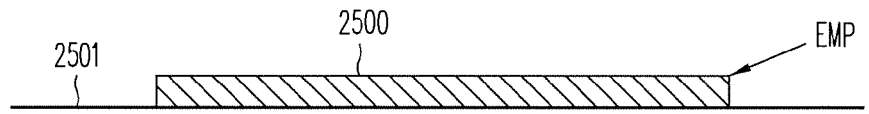
FIGS. 23(a) and 23(b) show EMP sensor 2500 provided on the surface of rigid substrate, in accordance with one embodiment of the present invention.
Figure 23B:
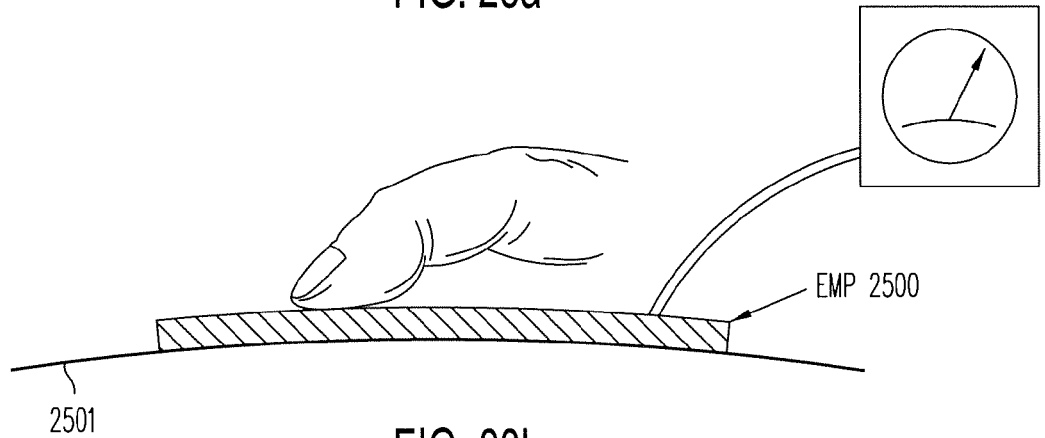

Alternatively, FIGS. 23(a) and 23(b) show EMP sensor 2500 provided on the surface of rigid substrate 2501, in accordance with one embodiment of the present invention. As shown in FIG. 23(a), EMP sensor 2500 is preferably charged by a voltage supply to a quiescent state. As shown in FIG. 23(b), when a force is applied directly on EMP sensor 2500, the EMP layer or layers within EMP sensor 2500 are deformed by the mechanical force experienced, thereby altering the capacitance of those EMP layers, resulting in a measurable voltage or current output from EMP sensor 2500. EMP sensor 2500 can therefore be used to directly measure a force applied on the surface.

Figure 24A:
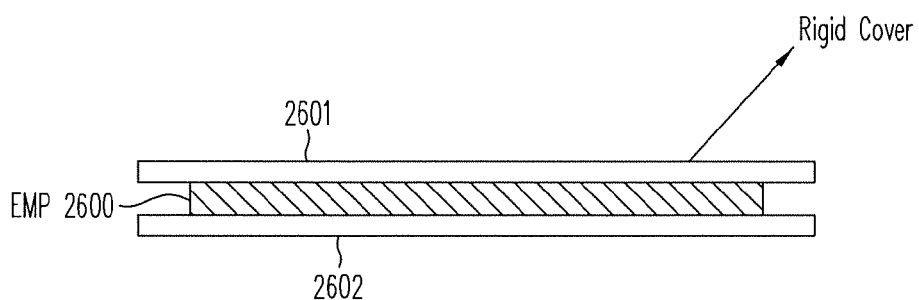
FIGS. 24(a) and 24(b) show EMP sensor 2600 placed between the surfaces of two compliant layers 601 and 602, in accordance with one embodiment of the present invention.
Figure 24B:
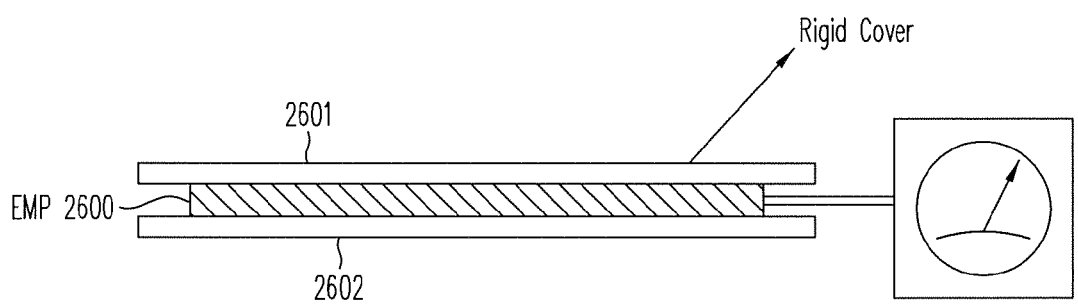

In a further configuration, FIGS. 24(a) and 24(b) show EMP sensor 2600 placed between the surfaces of two rigid layers 2601 and 2602, in accordance with one embodiment of the present invention. As shown in FIG. 24(a), EMP sensor 2600 is preferably charged by a voltage supply to a quiescent state. As shown in FIG. 24(b), when a force is applied on directly on either of layers 2601 and 2602, the EMP layer or layers within EMP sensor 2600 are compressed by the mechanical force experienced, thereby altering the capacitance of those EMP layers, resulting in a measurable voltage or current output from EMP sensor 2600.

Of importance is the fact that the EMP sensors disclosed herein are based on polymer films, which are highly flexible. As a result, EMP sensors may be made to conform to any kind of surface, and thus may be effective force sensors on curved or irregular surfaces, in addition to the flat surfaces provided in FIGS. 22-24 above.

Figure 25:
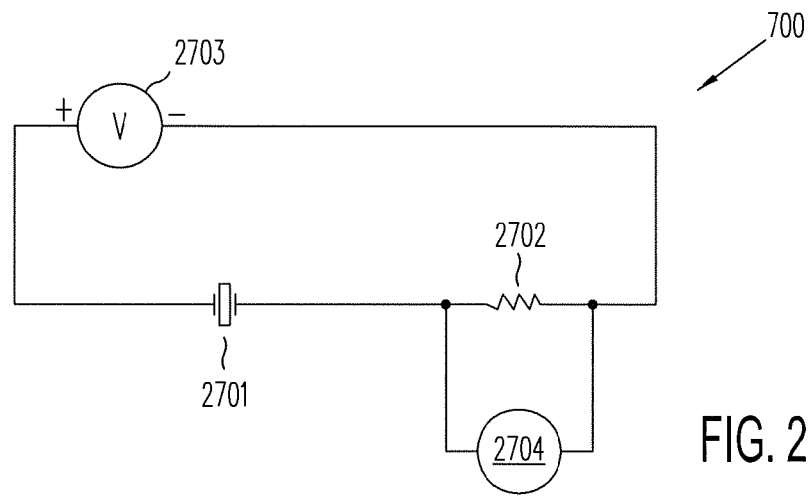
FIG. 25 shows schematic circuit 2700 in which EMP sensor 2701 is used, in accordance with one embodiment of the present invention.

FIG. 25 shows schematic circuit 2700 in which EMP sensor 2701 is used, in accordance with one embodiment of the present invention. As shown in FIG. 25, EMP sensor 2700 is connected in series with resistor 2702, which is provided to limit the charging and discharging current. Voltage source 2703 maintains EMP sensor 2700 in a charge state. Sensor output measurement circuit 2704 represents a circuit that is sensitive to a voltage change resulting from a change of capacitance caused by a mechanical force applied directly or indirectly on EMP sensor 2701.

Figure 26:
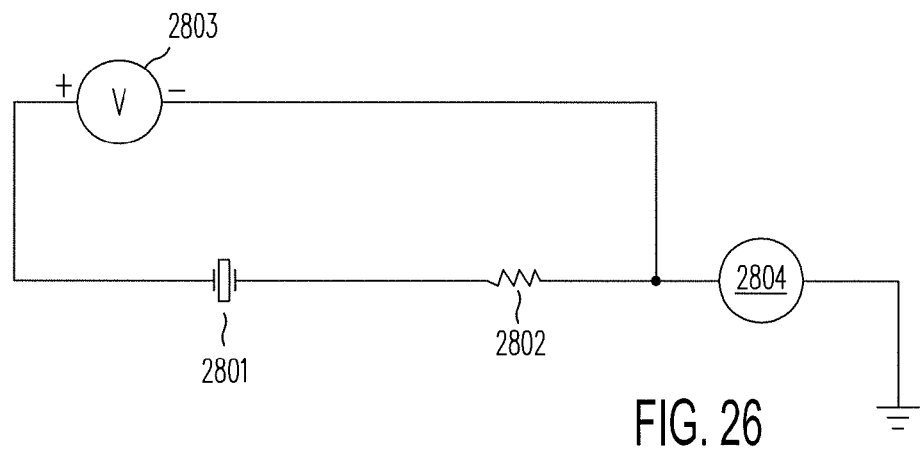
FIG. 26 shows schematic circuit 2800 in which EMP sensor 2801 is used, in accordance with one embodiment of the present invention.

FIG. 26 shows schematic circuit 2800 in which EMP sensor 2801 is used, in accordance with one embodiment of the present invention. As shown in FIG. 26, EMP sensor 2800 is connected in series with sensor output measurement circuit 2804 and resistor 2802, which is provided to limit the charging and discharging current. Voltage source 2803 maintains EMP sensor 2801 in a charge state. Sensor output measurement circuit 2804 represents a circuit that is sensitive to a current resulting from a change of capacitance caused by a mechanical force applied directly or indirectly on EMP sensor 2801.

Although the examples herein use resistors as means for indicating quantitatively a change in the charged state in an EMP sensor, the use of resistors is only one of many ways that can be used. Any suitable means for providing a quantitative indication of a change in charged state in the EMP sensor may be used, such as an electrometer or any current measurement device.

Figure 27:
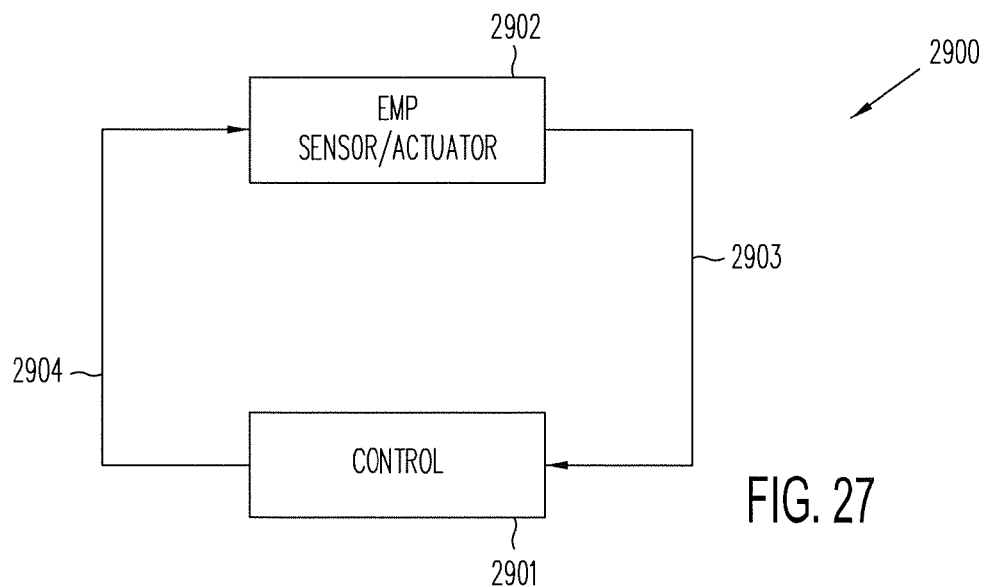
FIG. 27 shows schematic circuit 2900 in which control circuit 2901 receives from EMP sensor/actuator 2902 sensing signal 2903, representative of the tactile pressure experienced at EMP sensor/actuator 2902 and provides a haptic response through actuating signal 2904, in accordance with one embodiment of the present invention.

An EMP sensor disclosed herein in its charged state provides a significant voltage output in response to the range pressures typically encountered in a mobile application, such as a keyboard. Furthermore, as mentioned above, such an EMP sensor can act as an actuator (i.e., unlike an EMP sensor, which receives a mechanical input to provide an electrical response, an actuator receives an electrical input to provide a mechanical response). Suitable placement of switches allows reconfiguring a circuit with one or more EMP sensors to switch between sensor and actuator functions. An EMP sensor circuit disclosed herein may have dedicated terminals to charge the EMP sensor and separate terminals to receive the electrical output signal. As both an EMP sensor and an EMP actuator according to the present invention, the EMP sensor/actuator may be applicable to analog sensing of touch (e.g., as an analog sensor with at least 3 levels of touch sensing: no sensing, intend to press, button release). In response to the sensed touch, the EMP sensor/actuator provides as a haptic response local sound, local vibration or deformation. The haptic response may also be a programmable blocking force that bears an appropriate relationship (e.g., a linear relationship) to the sensed pressure. Of course, the EMP sensor/actuator needs to be supported by a closed-loop algorithm and drive electronics. Sensing an analog pressure with more than two levels provides a more realistic and richer user experience. FIG. 27 shows schematic circuit 2900 in which control circuit 2901 receives from EMP sensor/actuator 2902 sensing signal 2903, representative of the tactile pressure experienced at EMP sensor/actuator 2902 and provides a haptic response through actuating signal 904, in accordance with one embodiment of the present invention.

Figure 28:
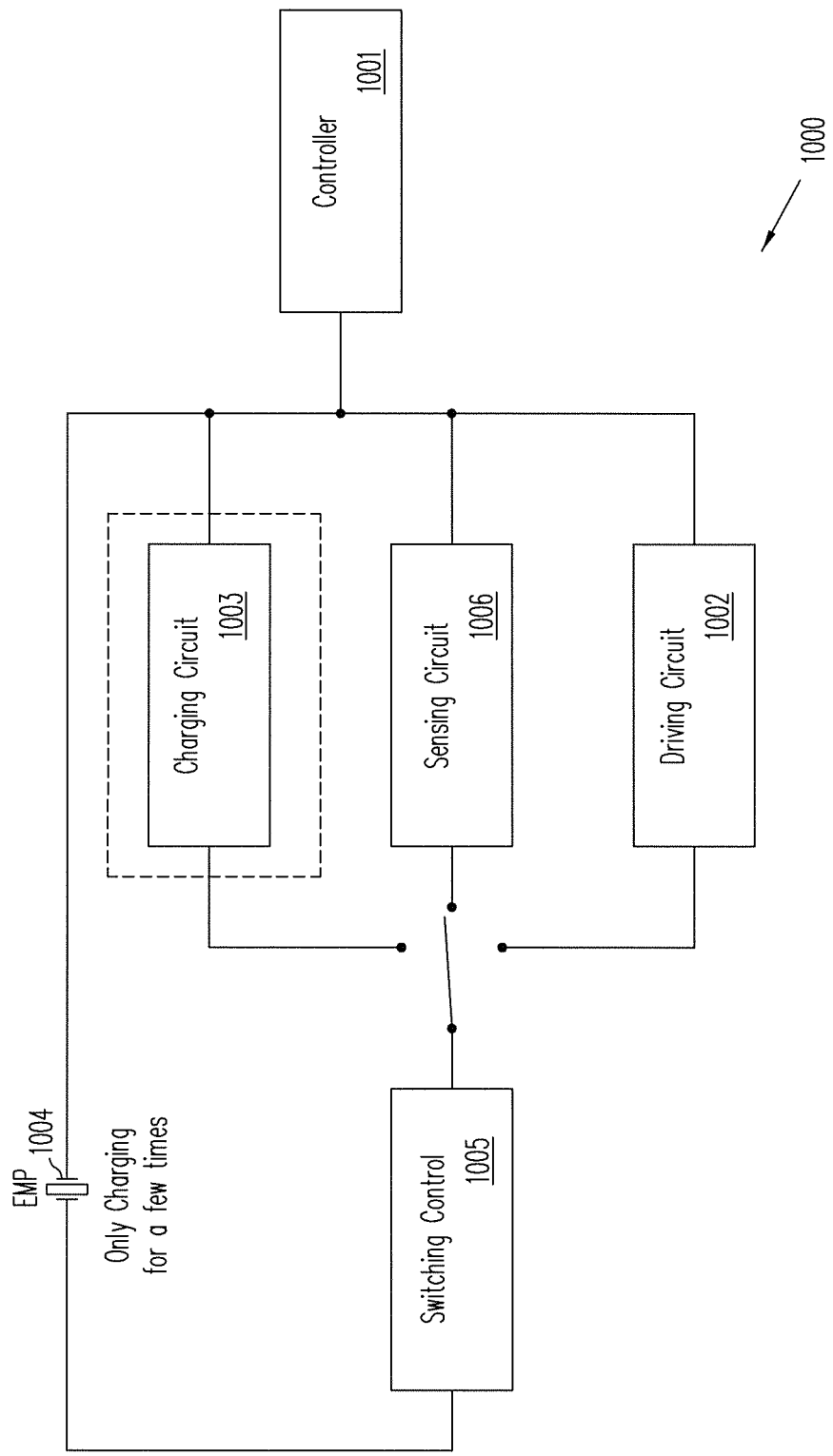
FIG. 28 illustrates system 1000 in which EMP transducer 1004 performs both actuation and sensing operations, in accordance with one embodiment of the present invention.

FIG. 28 illustrates system 1000 in which EMP transducer 1004 performs both actuation and sensing operations, in accordance with one embodiment of the present invention. As shown in FIG. 28, system 1000 includes EMP transducer 1004, controller 1001, driving circuit 1002, charging circuit 1003, switching circuit 1005, and sensing circuit 1006. Initially, controller 1001 sets switching circuit 1005 to connect charging circuit 1003 to EMP transducer 1004 to charge EMP transducer 1004 in preparation of its sensing operations, in the manner such as illustrated by any of the sensing operations discussed above. EMP transducer 1004 may be, for example, a pressure sensor. When charging of EMP transducer 1004 is complete, controller 1001 sets switching circuit 1005 to connect EMP transducer 1004 to sensing circuit 1006. Controller 1001 then monitors sensing circuit 1006 for any occurrence of a sensed event at EMP transducer 1004. When such an event is detected, controller 1001 analyzes the event to determine an appropriate response (e.g., a haptic response). To effectuate the response, controller 1001 sets switching circuit 1005 to connect EMP transducer 1004 to driving circuit 1002. Controller 1001 then causes driving circuit 1002 to provide a suitable driving signal for the appropriate response to EMP transducer 1004. The driving signal causes EMP transducer 1004 to provide the intended response in a manner such as any of the actuation operations discussed above (e.g., a haptic vibration or sound).

The above detailed description is provided to illustrate the specific embodiments of the present invention and is not intended to be limiting. Numerous variations and modifications within the scope of the present invention are possible. The present invention is set forth in the following claims.

We claim:

1. A system comprising one or more electromechanical polymer (EMP) transducers, each EMP transducer comprising:
   a plurality of EMP layers each having a first surface and a second surface separated by a thickness that is less than 10 microns, each EMP layer being formed out of an electrostrictive polymer; and
   a plurality of electrodes each provided adjacent one or more of the EMP layers, wherein the electrodes are connected to provide or to sense, in each EMP layer, a voltage across the first surface and the second surface, wherein the EMP transducer generates an acceleration of greater than 0.5 Gs under an electric field.

2. The system of claim 1, wherein each EMP transducer is independently controlled or sensed.

3. The system of claim 1, wherein at least one of the EMP layers is stretched.

4. The system of claim 3, wherein the EMP layer is stretched biaxially.

5. The system of claim 1, wherein the electric field is an AC electric field which causes the EMP transducer to vibrate.

6. The system of claim 5, wherein the EMP transducer vibrates at a frequency proportional to the frequency of the AC electric field.

7. The system of claim 1, further comprising a substrate having a surface to which one or more of the EMP transducers are attached, wherein the provided voltage creates an electric field which causes the attached EMP transducers to deform the surface in response to the applied electric field.

8. The system of claim 1, wherein the EMP layers in each EMP transducer are of different thicknesses and sizes.

9. The system of claim 8, wherein the EMP transducers have EMP layers that are of different thicknesses.

10. The system of claim 1, wherein the EMP transducers are arranged regularly on a surface.

11. The system of claim 10, wherein the EMP transducers are arranged in an array.

12. The system of claim 10, wherein the EMP transducers are provided at selected positions of a grid.

13. The system of claim 10, wherein the EMP transducers are positioned at selected corners of a regular polygon.

14. The system of claim 1, wherein EMP transducer comprises multiple component transducers stacked together, the component transducers being of a different size, a different layer thickness, or a different number of EMP layers relative to each other.

15. The system of claim 1, wherein each EMP transducer has a response latency of less than 40 milliseconds.

16. The system of claim 1, wherein each EMP transducer has a decay me of less than 40 milliseconds.

17. The system of claim 1, wherein the EMP layer is between 0.1 um to 10 um.

18. The system of claim 17, wherein the EMP layer is 5 microns thick or less.

19. The system of claim 17, wherein the EMP layer is 3 microns thick or less.

20. The system of claim 1, further comprising a substrate bonded to the EMP transducers.

21. The system of claim 20, wherein the substrate is bonded to the EMP transducers by an adhesive.

22. The system of claim 20, wherein the substrate is bonded to the EMP transducers by thermal lamination.

23. The system of claim 20, wherein the substrate is rigid.

24. The system of claim 20, wherein the substrate is flexible.

25. The system of claim 1, wherein the EMP transducer is transparent.

26. The system of claim 1, wherein the EMP transducer is semitransparent.

27. The system of claim 1, wherein the EMP transducer is opaque.

28. The system of claim 1, further comprising a controller providing individual control signals to the electrodes of each EMP transducers.

29. The system of claim 28, wherein the EMP transducers are positioned in predetermined locations such that the EMP transducer are controlled by the individual signals to function as a phased array of actuators to focus the haptic responses of the EMP transducers.

30. The system of claim 28, wherein the EMP transducers are positioned at predetermined locations and controlled by the individual signals to achieve pre-determined displacements at the predetermined locations.

31. The system of claim 30, wherein one of the EMP transducers achieves an acceleration magnitude of greater than 0.5 G.

32. The system of claim 1, wherein the electrostrictive polymer comprises one or more polymers selected from the group consisting of a polymer, copolymer, or terpolymer of vinylidene fluoride.

33. The system of claim 1, wherein the electrostrictive polymer comprises a polymer selected from a group of polymers consisting of: $P(VDF_x\text{-}TrFE_y\text{-}CFE_{1-x-y})$ (CFE: chlorofluoroethylene), $P(VDF_x\text{-}TrFE_y\text{-}CTFE_{1-x-y})$ (CTFE: chlorotrifluoroethylene), Poly(vinylidene fluoride-trifluoroethylene-vinylidede chloride) (P(VDF-TrFE-VC)), poly(vinylidene fluoride-tetrafluoroethylene-chlorotrifluoroethylene) (P(VDF-TFE-CTFE)), poly(vinylidene fluoride-trifluoroethylene-hexafluoropropylene), poly(vinylidene fluoride-tetrafluoroethylene-hexafluoropropylene), poly(vinylidene fluoride-trifluoroethylene-tetrafluoroethylene), poly(vinylidene fluoride-tetrafluoroethylene-tetrafluoroethylene), poly(vinylidene fluoride-tri fluoroethylene-vinyl fluoride), poly(vinylidene fluoride-tetrafluoroethylene-vinyl fluoride), poly(vinylidene fluoride-trifluoroethylene-perfluoro(methyl vinyl ether)), poly(vinylidene fluoride-tetrafluoroethylene-perfluoro (methyl vinyl ether)), poly(vinylidene fluoride-trifluoroethylene-bromotrifluoroethylene, polyvinylidene), poly(vinylidene fluoride-tetrafluoroethylene-chlorofluoroethylene), poly(vinylidene fluoride-trifluoroethylene-vinylidene chloride), and poly(vinylidene fluoride-tetrafluoroethylene vinylidene chloride), where x has a value in the range between 0.5 and 0.75, y has a value in the range between 0.45 and 0.2.

34. The system of claim 1, wherein the elecctrostrictive polymer comprises a P(VDF-TrFE-CFE) or P(VDF-TrFE-CTFE) terpolymer.

35. The system of claim 1, wherein the electrostrictive polymer comprises a high energy electron irradiated P(VDF-TrFE).

36. The system of claim 1, wherein the electrostrictive polymer comprises a blend of electrostrictive polymers with PVDF and PVDF copolymers.

37. The system of claim 36, wherein the blend includes one or more of P(VDF-CTFE), P(VDF-HFP), P(VDF-CFE), P(VDF-TrFE), and P(VDF-TFE) polymers.

38. The system of claim 1, wherein the EMP transducer acts as a temperature change sensor in response to variations in temperature in its environment.

39. The system of claim 1, wherein the EMP transducer cools in response to activation signals in the electrodes.

40. The system of claim 39, wherein the cooling in the EMP transducer is used in a haptic application to provide tactile feedback to a user.

41. The system of claim 1, further comprising a force receiving surface structurally connected with the EMP layers for transmitting an external force to the EMP layers.

42. The system of claim 41, further comprising a substrate bonded to one side of one of the EMP transducers, and wherein the force receiving surface being provided on the side of the EMP sensor opposite to the side of the EMP sensor bonded to the substrate.

43. The system of claim 41, wherein the force receiving surface is provided on a compliant metal plate.

* * * * *

UNITED STATES PATENT AND TRADEMARK OFFICE
CERTIFICATE OF CORRECTION

PATENT NO. : 9,183,710 B2
APPLICATION NO. : 13/683963
DATED : November 10, 2015
INVENTOR(S) : Brian C. Zellers et al.

Page 1 of 1

It is certified that error appears in the above-identified patent and that said Letters Patent is hereby corrected as shown below:

In The Claims

Column 22, line 31, "me" should be --time--

Column 22, line 55, "transducers" should be --transducer--

Column 22, line 58, "transducer" should be --transducers--

Column 22, line 63, "pre-determined" should be --predetermined--

Column 23, line 29, "elecctrostrictive" should be --electrostrictive--

Signed and Sealed this
Fifth Day of April, 2016

Michelle K. Lee
*Director of the United States Patent and Trademark Office*